(12) United States Patent
Lee

(10) Patent No.: US 11,355,168 B2
(45) Date of Patent: Jun. 7, 2022

(54) STACKED SEMICONDUCTOR DEVICE AND METHOD OF OPERATING SAME

(71) Applicant: SK hynix Inc., Gyeonggi-do (KR)

(72) Inventor: Dong Uk Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/012,593

(22) Filed: Sep. 4, 2020

(65) Prior Publication Data

US 2021/0304802 A1   Sep. 30, 2021

(30) Foreign Application Priority Data

Mar. 30, 2020  (KR) .................. 10-2020-0038257

(51) Int. Cl.
  *G11C 7/10*  (2006.01)
  *G11C 7/22*  (2006.01)
  *H01L 25/065*  (2006.01)

(52) U.S. Cl.
  CPC .......... *G11C 7/1096* (2013.01); *G11C 7/1084* (2013.01); *G11C 7/222* (2013.01); *H01L 25/0657* (2013.01)

(58) Field of Classification Search
  CPC ..... G11C 7/1096; G11C 7/222; G11C 7/1084; H01L 25/0657
  See application file for complete search history.

(56) References Cited

U.S. PATENT DOCUMENTS

| 8,159,887 | B2* | 4/2012 | Kizer | G11C 7/1078 |
| | | | | 365/193 |
| 8,238,186 | B2* | 8/2012 | Bae | G11C 7/1045 |
| | | | | 365/219 |
| 8,923,079 | B1 | 12/2014 | Park et al. | |
| 9,405,721 | B2* | 8/2016 | Ayyapureddi | H03M 13/05 |
| 9,501,352 | B2* | 11/2016 | Hoya | G06F 11/1012 |
| 10,318,469 | B2* | 6/2019 | Jang | G06F 13/4243 |
| 2019/0172512 | A1* | 6/2019 | Oh | G11C 7/1093 |
| 2019/0198089 | A1* | 6/2019 | Kim | G11C 7/1006 |
| 2019/0325926 | A1 | 10/2019 | Kondo et al. | |
| 2020/0151053 | A1* | 5/2020 | Cha | G06F 11/1044 |

\* cited by examiner

*Primary Examiner* — Tri M Hoang
(74) *Attorney, Agent, or Firm* — IP & T Group LLP

(57) ABSTRACT

A stacked semiconductor device includes a base die including an input buffer and a parallel circuit; and a plurality of core dies stacked over the base die, the core dies coupled to the base die through a plurality of through-electrodes, wherein the input buffer receives write data in a first order and a write inversion signal, the parallel circuit sorts consecutive bits of the write data to be positioned adjacent to each other so that the write data becomes first parallel data and to transfer the first parallel data to respective first to n-th internal input/output lines, and each of the core dies includes an input control circuit to re-sort the first parallel data transferred via the respective first to n-th internal I/O lines into the write data and a write inversion circuit to selectively invert the re-sorted write data according to the write inversion signal.

22 Claims, 18 Drawing Sheets

STACKED SEMICONDUCTOR DEVICE AND METHOD OF OPERATING SAME

CROSS-REFERENCE TO RELATED APPLICATIONS

The present application claims priority to Korean Patent Application No. 10-2020-0038257, filed on Mar. 30, 2020, which is herein incorporated by reference in its entirety.

BACKGROUND

1. Field

Embodiments of the disclosure relate to semiconductor designing technology and, more particularly, to a data input/output method of a stacked semiconductor device supporting data bus inversion (DBI).

2. Description of the Related Art

As semiconductor technology makes dramatic progress, semiconductor integrated devices such as packages are required to have a higher degree of integration and performance. To this end, current technology is moving away from a two-dimensional structure in which semiconductor chips are arranged on one plane over a printed circuit board (PCB) by using wires or bumps. Instead, new diverse technologies related to a three-dimensional structure in which a plurality of semiconductor chips are vertically stacked are emerging.

The three-dimensional structure may be implemented by a stacked semiconductor device in which a plurality of semiconductor chips are vertically stacked. The semiconductor chips stacked in a vertical direction are electrically connected to each other through through-electrodes (e.g., through-silicon-vias, TSVs) and are mounted on a semiconductor packaging substrate.

Methods for efficiently transmitting signals/data between the semiconductor chips in the stacked semiconductor device are being developed.

SUMMARY

Embodiments of the disclosure provide a stacked semiconductor device capable of supporting a data bus inversion (DBI) function upon data input/output between semiconductor chips in a stacked semiconductor device, and a semiconductor system including the same.

According to an embodiment of the disclosure, a stacked semiconductor device includes a base die including an input buffer and a parallel circuit; and a plurality of core dies stacked over the base die, the plurality of core dies being coupled to the base die through a plurality of through-electrodes, wherein the input buffer is configured to receive write data in a first order and a write inversion signal, wherein the parallel circuit is configured to sort consecutive bits of the write data to be positioned adjacent to each other so that the write data becomes first parallel data and to transfer the first parallel data to respective first to n-th internal input/output lines, and wherein each of the plurality of core dies includes an input control circuit configured to re-sort the first parallel data transferred via the respective first to n-th internal I/O lines into the write data and a write inversion circuit configured to selectively invert the re-sorted write data according to the write inversion signal.

According to an embodiment of the disclosure, a semiconductor device includes a first semiconductor chip for receiving write data in a first order and a write inversion signal, and for sorting consecutive bits of the write data to be positioned adjacent to each other so that the write data becomes parallel data and for transferring the parallel data to respective first to n-th internal input/output lines; and at least one second semiconductor chip for converting the parallel data transferred via the respective first to n-th internal input/output lines into the write data and for selectively inverting the converted write data according to the write inversion signal.

According to an embodiment of the disclosure, a semiconductor device includes a first semiconductor chip for receiving read data in a first order from a memory area, for sorting consecutive bits of the read data to be positioned adjacent to each other so that the read data becomes parallel data, and for transferring the parallel data to respective first to n-th internal input/output lines; and a second semiconductor chip for converting the parallel data transferred via the respective first to n-th internal input/output lines into the read data, for generating a read inversion signal using the converted read data, and for selectively inverting the converted read data according to the read inversion signal.

According to an embodiment of the disclosure, a method of operating a stacked semiconductor device including a base die and a plurality of core dies stacked on the base die and coupled through a plurality of through-electrodes, the method includes: receiving, by the base die, write data in a first order and a write inversion signal; sorting, by the base die, consecutive bits of the write data to be positioned adjacent to each other so that the write data becomes first parallel data and transferring the first parallel data to respective first to n-th internal input/output lines; converting, by the plurality of core dies, first parallel data transferred via the respective first to n-th internal input/output lines into the write data; and selectively inverting, by the plurality of core dies, the converted write data according to the write inversion signal.

According to an embodiment of the disclosure, a semiconductor device includes a first semiconductor chip suitable for arranging a sequence of bits into parallel series of bits according to a prefetch scheme, the bits within each of the parallel series being consecutive; parallel lines suitable for transferring the parallel series, respectively; and a second semiconductor chip suitable for recovering the transferred parallel series into the sequence and selectively inverting the bits within the recovered sequence according a data bus inversion (DBI) scheme.

According to an embodiment of the disclosure, a semiconductor device includes a first semiconductor chip suitable for arranging a sequence of bits into parallel series of bits according to a prefetch scheme, the bits within each of the parallel series being consecutive; parallel lines suitable for transferring the parallel series, respectively; and a second semiconductor chip suitable for recovering the transferred parallel series into the sequence and selectively inverting the bits within the recovered sequence according a data bus inversion (DBI) scheme.

According to proposed embodiments, a stacked semiconductor device and method of operating the stacked semiconductor device may support a DBI function upon data input/output between semiconductor chips in a stacked semiconductor device, thereby reducing current consumption and noise.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
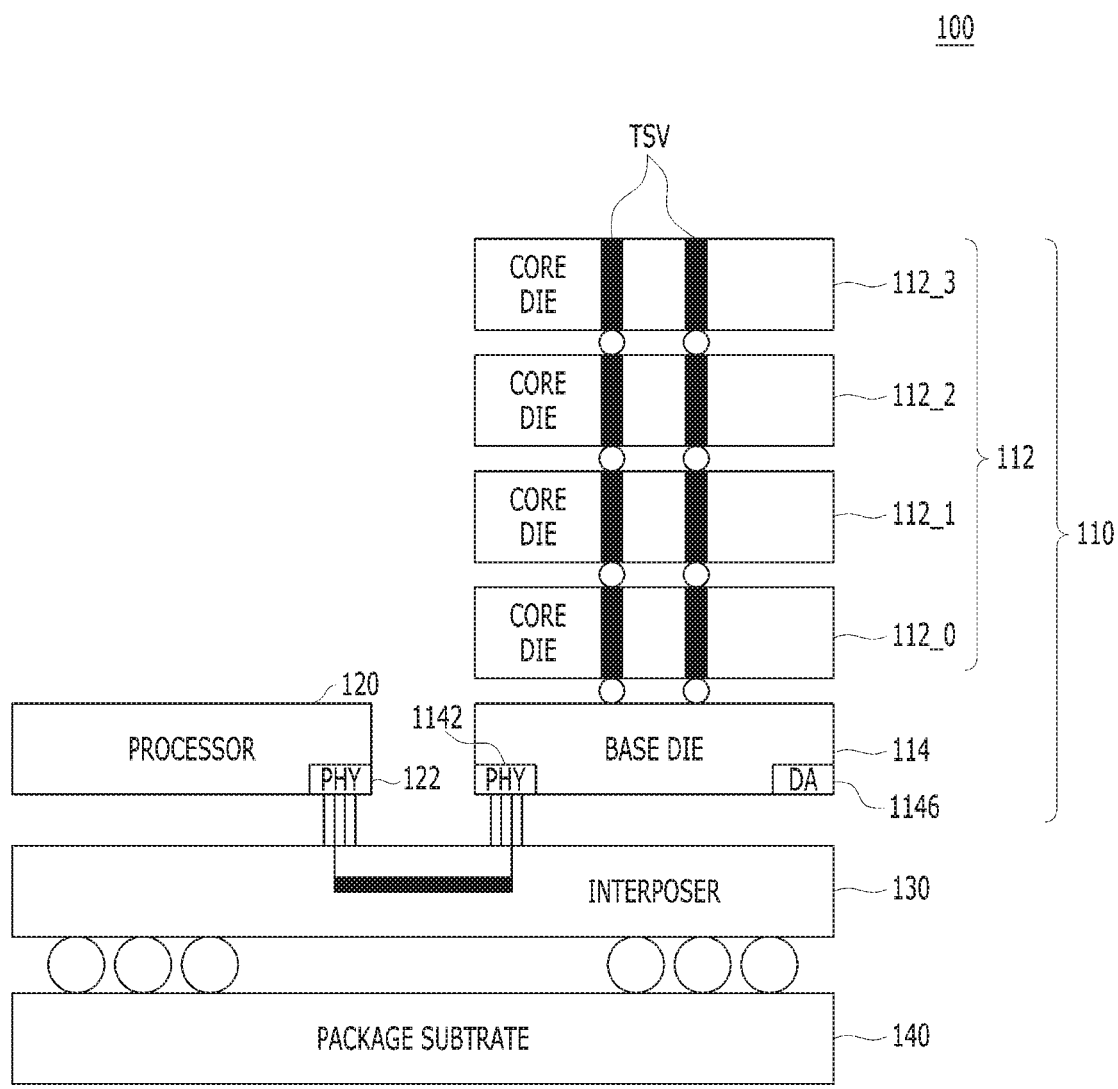
FIG. 1 is a view illustrating a semiconductor system according to an embodiment of the present disclosure.

Various embodiments of the present teachings will be described below in more detail with reference to the accompanying drawings. The present teachings may, however, be embodied in different forms and should not be construed as being limited to the embodiments set forth herein. Rather, these embodiments are provided so that this disclosure will convey the scope of the present teachings to those skilled in the art. Throughout the disclosure, like reference numerals refer to like parts throughout the various figures and embodiments of the present teachings.

It is noted that reference to "an embodiment," "another embodiment," or the like does not necessarily mean only one embodiment, and different references to any such phrase are not necessarily to the same embodiment(s).

It will be understood that, although the terms "first," "second," "third," and so on may be used herein to describe various elements, these elements are not limited by these terms. These terms are used to distinguish one element from another element. Thus, a first element described below could also be termed a second or third element without departing from the spirit and scope of the present teachings.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well, and vice versa, unless the context clearly indicates otherwise. The articles 'a' and 'an' as used in this application and the appended claims should generally be construed to mean 'one or more' unless specified otherwise or it is clear from the context to be directed to a singular form.

Hereinafter, a semiconductor system including a stacked semiconductor device will be described. The semiconductor system in accordance with the embodiment of the present teachings may be embodied in the form of a system-in-package, a multi-chip package, or a system-on-chip, and it may also be embodied in the form of a package-on-package.

FIG. 1 is a view illustrating a semiconductor system 100 according to an embodiment of the present disclosure.

Referring to FIG. 1, the semiconductor system 100 may include a semiconductor device 110, and a controller.

Because the controller 120 is generally included in diverse processors, such as a Central Processing Unit (CPU), a Graphic Processing Unit (GPU), and an Application Processor (AP), the controller 120 may be also referred to as a processor as designated in FIG. 1. The semiconductor system 100 may also include an interposer 130, and a package substrate 140.

The interposer 130 may be mounted onto the package substrate 140.

The semiconductor device 110 and the controller 120 may be mounted onto the interposer 130.

A physical area (PHY) 1142 of the stacked semiconductor device 110 may be coupled to a physical area (PHY) 122 of the controller 120 via the interposer 130. An interface circuit for enabling communication between the stacked semiconductor device 110 and the controller 120 may be disposed in each of the physical areas 1142 and 122.

The stacked semiconductor device 110 may form a High Bandwidth Memory (HBM). The HBM may have a high bandwidth corresponding to an increased number of I/O units resulting from stacking a plurality of dies (i.e., semiconductor chips) in a vertical direction and electrically connecting them via through-electrodes TSVs.

The plurality of dies may include a base logic die 114 (also referred to simply as base die) and a plurality of core dies 112. The core dies 112 may be sequentially stacked over the base logic die 114, and coupled to each other via the through-electrodes TSVs. Although FIG. 1 shows four stacked core dies 112, e.g., first to fourth core dies 112_0 to 112_3, the present disclosure is not limited thereto. It is noted that the number of the stacked core dies may vary depending on the design of the semiconductor device.

Each of the core dies 112 may be implemented with a memory chip. Each of the core dies 112 may include a plurality of memory cells for storing data and circuits for supporting a core operation on the memory cells. The base logic die 114 may act as an interface between the core dies 112 and the controller 120 so that various functions within the semiconductor system 100, such as a memory management function (e.g., a refresh management function and a power management function for the memory cells), and a timing adjustment function between the core dies 112 and the controller 120, may be performed.

The base logic die 114 may include the physical area 1142 and a direct access area (DA) 1146. In the physical area 1142, an interface circuit for communication with the controller 120 may be disposed. In the direct access area 1146, an interface circuit for directly testing the stacked semiconductor device 110 may be disposed. The base logic die 114 may also be referred to as a buffer die.

Figure 2:
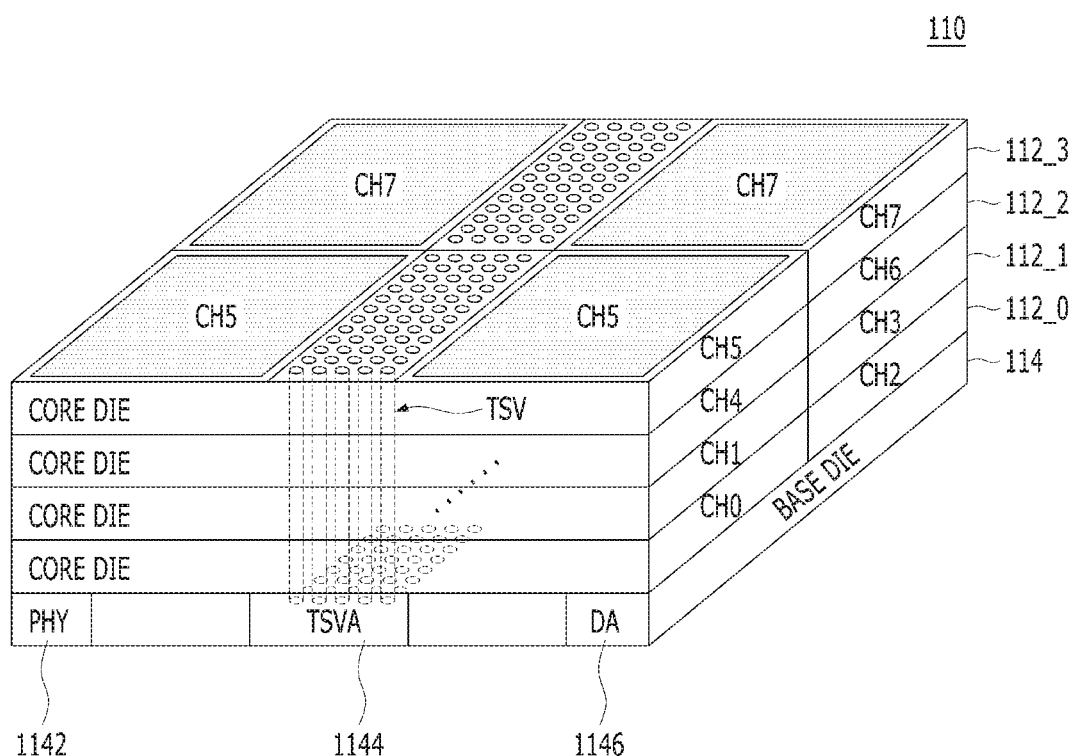
FIG. 2 is a perspective view illustrating a stacked semiconductor device as illustrated in FIG. 1.

FIG. 2 is a perspective view illustrating a stacked semiconductor device 110 as illustrated in FIG. 1.

Referring to FIG. 2, each of the first to fourth core dies 112_0 to 112_3 may include one or more channels. In the example of FIG. 2, as one core die includes two channels, the stacked semiconductor device 110 may have first to eighth channels CH0 to CH7. For example, the first core die 112_0 may include memory areas corresponding to the first and third channels CH0 and CH2, and the second core die 112_1 may include memory areas corresponding to the second and fourth channels CH1 and CH3. The third core die 112_2 may include memory areas corresponding to the fifth and seventh channels CH4 and CH6, and the fourth core die 112_3 may include memory areas corresponding to the sixth and eighth channels CH5 and CH7.

For example, first to eighth memory banks may correspond to each channel. Further, a plurality of through-electrodes TSVs may be disposed to pass through the first to fourth core dies 112_0 to 112_3 and may correspond to the first to eighth channels CH0 to CH7, respectively. When each channel has a bandwidth of 128 bits (i.e., two 128-bit channels per die), the through-electrodes TSVs and corresponding I/O units may be configured to transfer 1024 bits of data. Each channel may be similar to a standard DDR (double data rate) memory interface, but may be completely independent and therefore each channel within one stacked semiconductor device and even within one die may operate at a different frequency and/or different timings.

The base logic die 114 may communicate with the controller 120 (see FIG. 1). For example, the base logic die 114 may receive commands, addresses, and data from the controller 120, and provide the received commands, addresses, and data to the first to fourth core dies 112_0 to 112_3.

A physical area (PHY) 1142, a TSV area (TSVA) 1144, and a direct access area (DA) 1146 may be disposed in the base logic die 114. The physical area (PHY) 1142 may be the same part as the physical area (PHY) 1142 shown in FIG. 1, and the direct access area (DA) 1146 may be the same part as the direct access area (DA) 1146 shown in FIG. 1.

The physical area 1142 may be provided with an I/O circuit for interfacing with the controller 120. The physical area 1142 may be disposed in a first edge area of the base logic die 114, adjacent to the controller 120. The direct access area 1146 may be provided with an I/O circuit for directly interfacing with an external test device (not shown). The direct access area 1146 may be disposed in a second edge area of the base logic die 114, adjacent to the external test device. The second edge area may be disposed in a direction which is opposite to the first edge area. The TSV area 1144 may be an area for interfacing with the through-electrodes TSVs passing through the first to fourth core dies 112_0 to 112_3. The TSV area 1144 may be disposed between the physical area 1142 and the direct access area 1146, that is, the TSV area 1144 may be disposed at a central area of the base logic die 114.

The physical area 1142 may transfer signals received from the controller 120 to the TSV area 1144. The direct access area 1146 may transfer a test signal received from the external test device to the TSV area 1144. The TSV area 1144 may perform a predetermined signal processing operation, for example, a buffering operation, on the signal received from the physical area 1142 or the test signal received from the direct access area 1146 and may transfer the buffered signals to the first to fourth core dies 112_0 to 112_3 via the through-electrodes TSVs.

Various signals (data) may be transmitted and received between the semiconductor device and the controller, and a DBI function may be employed to more efficiently perform data input/output operations. The DBI function is a technique for reducing the number of data transitions. For example, where eight-bit data is transmitted, the data is transmitted, as it is if four or less bits are in transition and, if five or more bits are in transition, the data is inverted and transmitted, so that the number of data bits in transition remains four or less.

Figure 3:
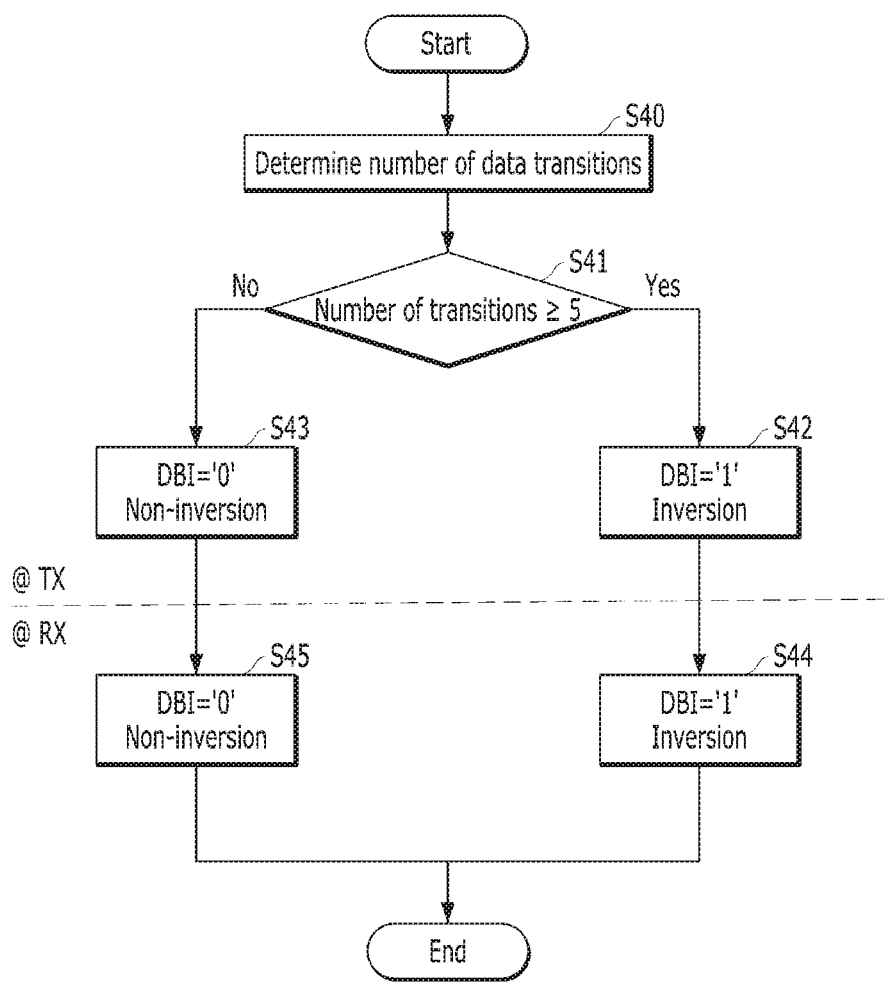
FIG. 3 is a flowchart illustrating a data input/output operation including a data bus inversion (DBI) function.
Figure 4:
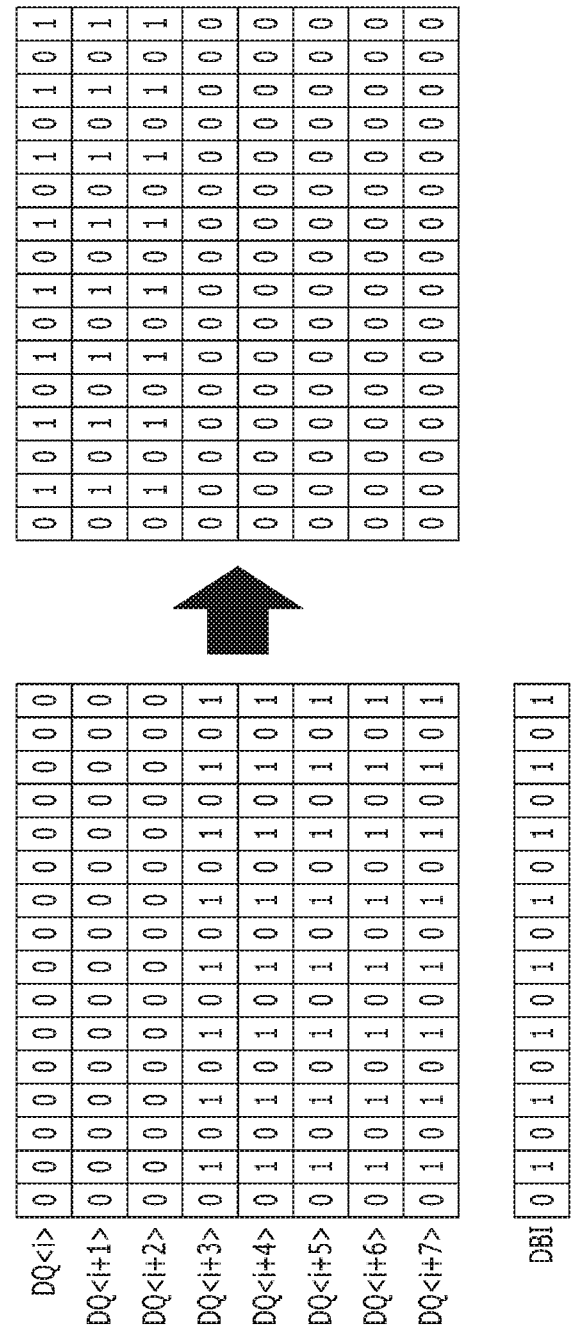
FIG. 4 is a diagram illustrating an example data input/output operation including a DBI function.

FIG. 3 is a flowchart illustrating a data input/output operation including a DBI function. FIG. 4 is a diagram illustrating an example data input/output operation including a DBI function. For ease of description, FIGS. 3 and 4 illustrate an example in which eight-bit data is transmitted.

Referring to FIG. 3, reference notation "@TX" may denote transmission of data from a transmit end (e.g., a controller), and reference notation "@RX" may denote reception of data by a receive end (e.g., a semiconductor device).

The controller may determine the number of transitions of write data to be transmitted (S40). When the number of data transitions is five or more ("YES" in S41), the controller may set an inversion signal DBI to a logic high level, and invert and transmit the write data (S42). In contrast, unless the number of data transitions is five or more (e.g., four or less) ("NO" in S41), the controller may set the inversion signal DBI to a logic low level and transmit the write data without inversion (S43). At this time, the controller may transfer the inversion signal DBI, along with the write data, to the semiconductor device.

When the inversion signal DBI is at the logic high level, the semiconductor device may invert and receive the write data (S44). In contrast, when the inversion signal DBI is at the logic low level, the semiconductor device may receive the write data without inversion (S45).

According to the DBI scheme, a one-bit inversion signal DBI is allocated per eight-bit data. Thus, a data input/output operation as illustrated in FIG. 4 may be carried out. For example, when the inversion signal DBI is at the logic low level, corresponding write data (DQ<i:i+7>) may be transmitted in the original phase and, when the inversion signal DBI is at the logic high level, the corresponding write data (DQ<i:i+7>) may be inverted and transmitted. Accordingly, the number of transitions of the data transmitted between the controller and the semiconductor device may be minimized thereby reducing current consumption and hence minimizing noise.

In the case of the stacked semiconductor device 110 described above in connection with FIGS. 1 and 2, the base die 114 receives the write data and inversion signal DBI, which are transferred from the controller 120, via the interface circuit in the physical area 1142. The base die 114 may receive the write data with or without inversion depending on the inversion signal DBI. The base die 114 may transfer the write data to the through-electrodes TSV via the interface circuit in the TSV area 1144. The first to fourth core dies 112_0 to 112_3 may write the write data, transferred via the through-electrodes TSV, to the core region (e.g., the memory cells in the core region).

At this time, the base die 114 may transfer the write data, transferred from the controller 120, to the through-electrodes TSV using a prefetch scheme. The prefetch scheme is a scheme that supports high-speed operation by parallelizing write data (DQ<i>) serially input via one data input/output (DQ) pad into data of multiple bits (e.g., four bits or two bits) and transferring the data.

Figure 5:
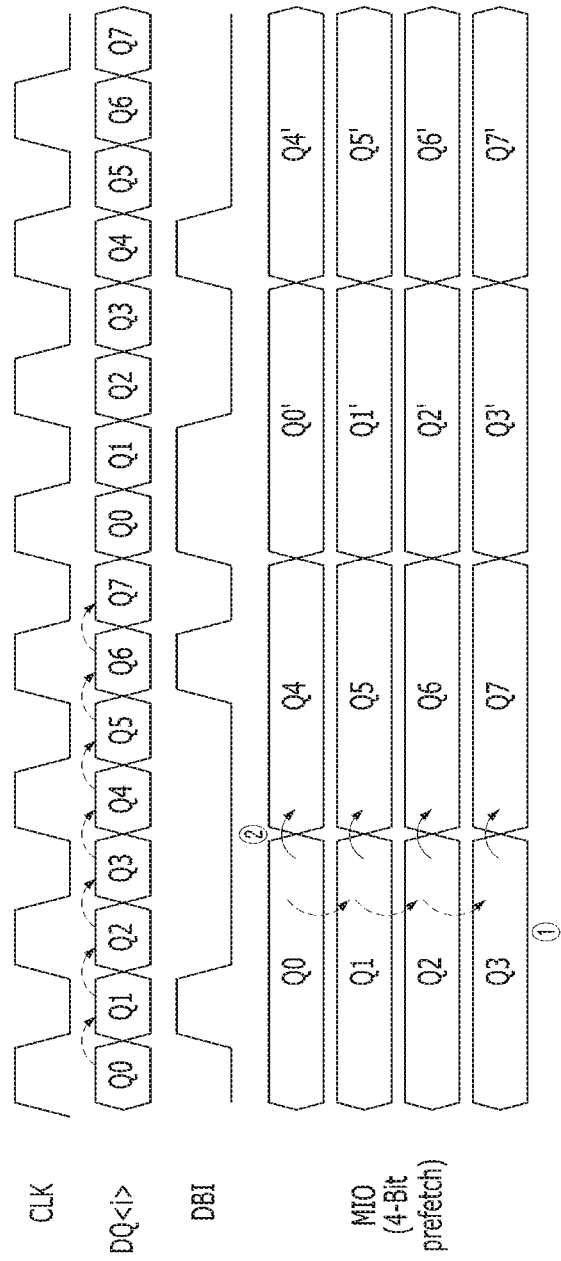
FIG. 5 is a waveform diagram illustrating a data input/output operation of a stacked semiconductor device using a prefetch scheme.

FIG. 5 is a waveform diagram illustrating a data input/output operation of a stacked semiconductor device using a prefetch scheme.

FIG. 5 illustrates a four bit prefetch scheme-applied data input/output operation. Eight-bit write data (DQ<i>) is serially input in the order of Q0 to Q7 via one DQ pad. The base die of the stacked semiconductor device may parallelize the eight-bit write data (DQ<i>) into two series of four-bit data (Q0 to Q3 and Q4 to Q7) and transfer the two series to the through-electrodes TSV via internal input/output lines (MIO).

In this case, while calculation of the inversion signal DBI is performed in the direction 1 from Q0 to Q7, the data actually transferred via the internal input/output lines MIO is in the direction 7 from Qn to Qn+4 (where, n=0, 1, 2, and 3). Thus, although the DBI function is used in the actual data input/output operation, it does not help reduce current consumption.

Described below is a method in which a stacked semiconductor device uses, in an internal data input/output operation, an inversion signal DBI transferred along with write data from an external device. In the following description, an example is activated in which any one 112_x of the first to fourth core dies 112_0 to 112_3 is activated. Upon bootup or initial operation, a chip ID signal may be allocated to each core die. For example, chip ID signals '00,' '01,' '10,' and '11' may be allocated to the first core die 112_0, the second core die 112_1, the third core die 112_2, and the fourth core die 112_3, respectively. According to an embodiment, any one core die 112_x of the first to fourth core dies 112_0 to 112_3 may be activated using the chip ID signal.

Figure 6:
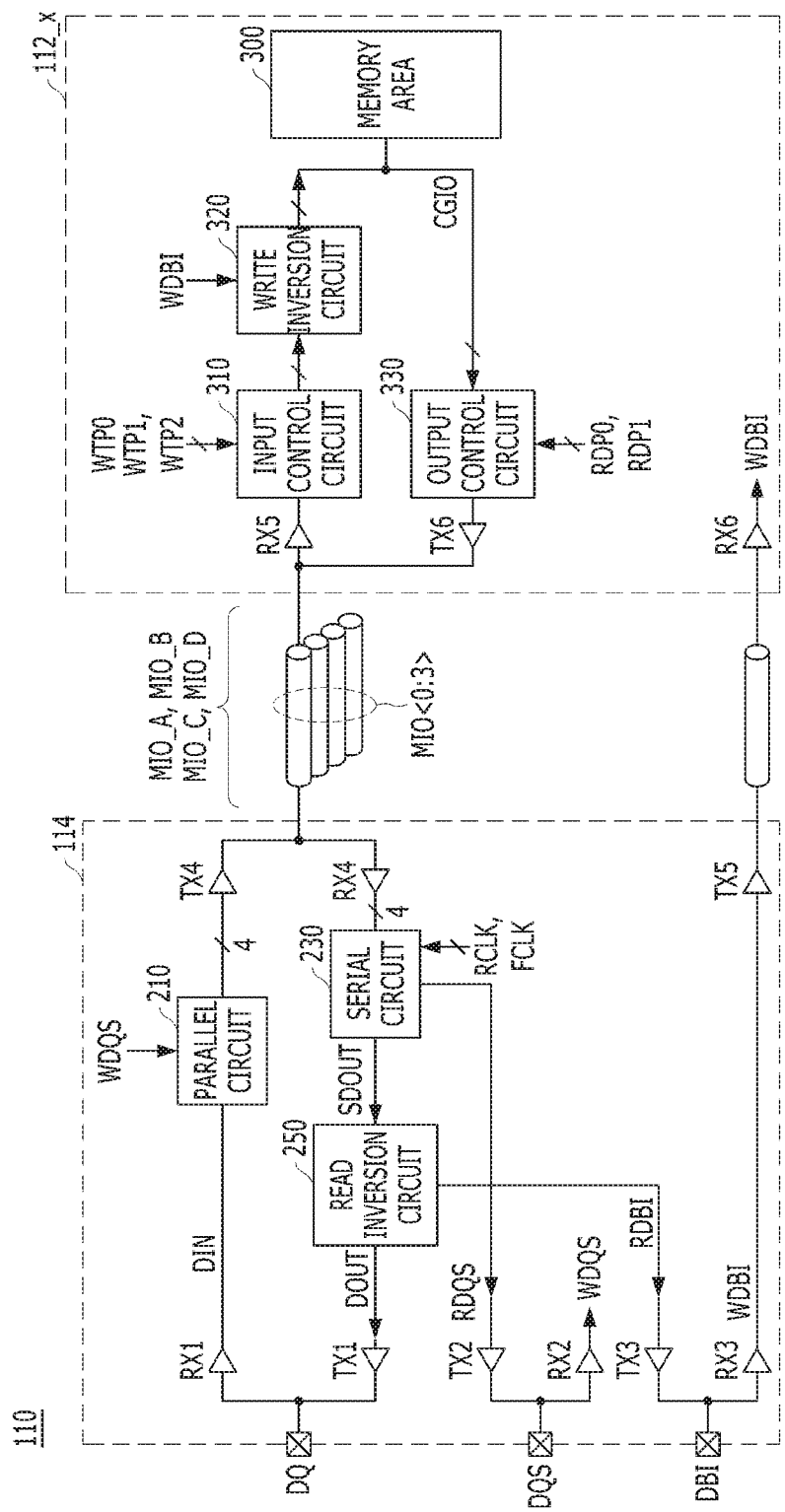
FIG. 6 is a block diagram illustrating a configuration of a stacked semiconductor device according to an embodiment of the present disclosure.

FIG. 6 is a block diagram illustrating a configuration of a stacked semiconductor device 110 according to an embodiment of the present disclosure.

Referring to FIG. 6, the base die 114 may include at least one data input/output (DQ) pad, a first input buffer RX1 to a fourth input buffer RX4, a first output buffer TX1 to a fifth output buffer TX5, a parallel circuit 210, a serial circuit 230, and a read inversion circuit 250. Although FIG. 6 illustrates one data input/output (DQ) pad and its corresponding circuits, multiple DQ pads and their corresponding circuits may be placed in practice. The base die 114 may connect to the core die 112_x via through-electrodes TSV. Among the through-electrodes TSV, through-electrodes TSV transferring data may be defined as "internal input/output lines (MIO)."

The first input buffer RX1 may connect to the DQ pad and, upon a write operation, buffer data input via the DQ pad and output the data as write data DIN. The second input buffer RX2 may connect to a DQS pad and, upon a write operation, buffer a strobe signal DQS input via the DQS pad and output the strobe signal DQS as a write strobe signal WDQS. The third input buffer RX3 may connect to a DBI pad and, upon a write operation, buffer an inversion signal DBI input via the DBI pad and output the inversion signal DBI as a write inversion signal WDBI. Although not shown in the drawings, the first to third input buffers RX1 to RX3 may be activated according to a write command WT.

The first output buffer TX1 may connect to the DQ pad and, upon a read operation, buffer/drive read data DOUT to be output via the DQ pad. The second output buffer TX2 may connect to the DQS pad and, upon a read operation, buffer/drive a read strobe signal RDQS to be output via the DQS pad. The third output buffer TX3 may connect to the DBI pad and, upon a read operation, buffer/drive a read inversion signal RDBI to be output via the DBI pad. Although not shown in the drawings, the first to third output buffers TX1 to TX3 may be activated according to a read command RD.

Data input/output via one DQ pad may be composed of serial data of a predetermined number of bits according to a configured burst length (BURST LENGTH). For example, eight-bit write data DIN may be serially input via one DQ pad in the order from Q0 to Q7, or eight-bit read data DOUT may be serially output via one DQ pad in the order from the first bit Q0 to the eighth bit Q7. The order of input/output of the write data DIN (in the order from Q0 to Q7 for example) and the read data DOUT serially input/output (in the order from Q0 to Q7 for example) via one DQ pad is defined as a "first order."

The parallel circuit 210 may receive the write data DIN in the first order, according to a write strobe signal WDQS, sort the data so that consecutive bits of the write data DIN are positioned adjacent to each other such that the write data in the first order becomes plural series of parallel data, and transfer the four series to respective first to n-th internal input/output lines (MIO<0:n−1>) (where n is an integer greater than or equal to 2). For example, when eight-bit write data DIN is serially input in the first order from the first bit Q0 to the eighth bit Q7, the parallel circuit 210 may sequentially transfer the first bit Q0 and the eighth bit Q7 to the first internal input/output line (MIO<0>), sequentially transfer the second bit Q1 and the third bit Q2 to the second internal input/output line (MIO<1>), sequentially transfer the sixth bit Q5 and the seventh bit Q6 to the third internal input/output line (MIO<2>), and sequentially transfer the fourth bit Q3 and the fifth bit Q4 to the fourth internal input/output line (MIO<3>). In other words, the parallel circuit 210 may sort the data (e.g., perform a prefetch operation) in the order of Q0, Q1, Q5, Q3, Q7, Q2, Q6, and Q4 so that consecutive bits are positioned adjacent to each other such that the series of bits of the write data in the first order becomes four parallel series of bits, the bits within each of the parallel series being consecutive, thereby minimizing transitions of data transferred to the first to fourth internal input/output lines (MIO<0:3>). A detailed configuration and operations of the parallel circuit 210 are described below in detail with reference to FIGS. 7 to 9. The parallel series transferred via the respective first to fourth internal input/output lines (MIO<0:3>) is defined as "parallel data (MIO_A, MIO_B, MIO_C, MIO_D)."

The fourth output buffer TX4 may buffer the parallel data (MIO_A, MIO_B, MIO_C, MIO_D) output from the parallel circuit 210 upon a write operation and transfer the parallel data to the first to fourth internal input/output lines (MIO<0:3>). The fourth input buffer RX4 may buffer the parallel data (MIO_A, MIO_B, MIO_C, MIO_D) transferred from the first to fourth internal input/output lines (MIO<0:3>) upon a read operation and transfer the parallel data to the serial circuit 230. Although FIG. 6 illustrates one fourth output buffer TX4 and one fourth input buffer RX4, there may be in practice provided a plurality of fourth output buffers TX4, the number of which corresponds to the number of the first to fourth internal input/output lines (MIO<0:3>), and a plurality of fourth input buffers RX4, the number of which corresponds to the number of the first to fourth internal input/output lines (MIO<0:3>).

The serial circuit 230 may convert the parallel data (MIO_A, MIO_B, MIO_C, MIO_D) transferred from the fourth input buffer RX4 into serial data SDOUT in the first order. The serial circuit 230 may generate a read strobe signal RDQS based on a first clock signal RCLK and a second clock signal FCLK, and convert the parallel data (MIO_A, MIO_B, MIO_C, MIO_D) into serial data SDOUT in the first order, based on the read strobe signal RDQS. The first clock signal RCLK and the second clock signal FCLK are complementary clock signals and may have phases inverted to each other. For example, the first clock signal RCLK may be generated in synchronization with a rising edge of an internal clock, and the second clock signal FCLK may be generated in synchronization with a falling edge of the internal clock. For example, the serial circuit 230 may convert the parallel data input in the order of Q0, Q1, Q5, Q3, Q7, Q2, Q6, and Q4 via the first to fourth internal input/output lines (MIO<0:3>) into serial data SDOUT in the first order from Q0 to Q7. A detailed configuration and operations of the serial circuit 230 are described below in detail with reference to FIGS. 15 to 17.

The read inversion circuit 250 may generate a read inversion signal RDBI using the serial data SDOUT, selectively invert the serial data SDOUT according to the read inversion signal RDBI, and output read data DOUT in the first order. When the read inversion signal RDBI is activated at the logic high level, the read inversion circuit 250 may invert the serial data SDOUT and provide the inverted serial data SDOUT to the first output buffer TX1.

Upon a write operation, the fifth output buffer TX5 may transfer the write inversion signal WDBI to the through-electrode TSV.

The core die 112_x may include a memory area 300, a fifth input buffer RX5 and a sixth input buffer RX6, a sixth output buffer TX6, an input control circuit 310, a write inversion circuit 320, and an output control circuit 330.

The fifth input buffer RX5 may buffer the parallel data (MIO_A, MIO_B, MIO_C, MIO_D) transferred from the first to fourth internal input/output lines (MIO<0:3>) upon a write operation. The sixth output buffer TX6 may transfer the parallel data (MIO_A, MIO_B, MIO_C, MIO_D) output from the output control circuit 330 upon a read operation to the first to fourth internal input/output lines (MIO<0:3>). The sixth input buffer RX6 may buffer the write inversion signal WDBI transferred from the through-electrode TSV upon a write operation. Although FIG. 6 illustrates one input buffer RX5 and one output buffer TX6, there may be in practice provided a plurality of input buffers RX5, the number of which corresponds to the number of the first to fourth internal input/output lines (MIO<0:3>), and a plurality of output buffers TX6, the number of which corresponds to the number of the first to fourth internal input/output lines (MIO<0:3>).

The input control circuit 310 may resort the parallel data (MIO_A, MIO_B, MIO_C, MIO_D) transferred from the fifth input buffer RX5 in the first order. The input control circuit 310 may resort the parallel data (MIO_A, MIO_B, MIO_C, MIO_D) according to a first to third write pulse signal WTP0 to WTP2 that are sequentially activated on every clock cycle. A detailed configuration and operations of the input control circuit 310 are described below in detail with reference to FIGS. 11 and 12.

The write inversion circuit 320 may selectively invert the resorted data according to the write inversion signal WDBI and transfer the inverted data to a core global line CGIO. Where the write inversion signal WDBI is activated at the logic high level, the write inversion circuit 320 may invert the data and provide the inverted data to the memory area 300.

Multiple cell blocks (not shown) and peripheral circuits (not shown) may be disposed in the memory area 300. The multiple cell blocks may include multiple memory cells connected between multiple word lines and multiple bit lines. The peripheral circuits may include, e.g., a word line driving circuit to drive the multiple word lines, a sense amplification circuit to detect and amplify data from the bit lines, and a write driver. The peripheral circuits may connect to the core global line CGIO and write the data provided via the core global line CGIO to the cell blocks upon a write operation and, upon a read operation, read data from the cell blocks and provide the data to the core global line CGIO. At this time, the data may be written or read in the first order.

The output control circuit 330 may receive a series of bits of the data in the first order, which is provided via the core global line CGIO, and sort the data so that consecutive bits are positioned adjacent to each other such that the data in the first order becomes plural series of parallel data. For example, upon receiving the data in the first order from the first bit Q0 to the eighth bit Q7, the output control circuit 330 may sequentially transfer the first bit Q0 and the eighth bit Q7 to the first internal input/output line (MIO<0>), sequentially transfer the second bit Q1 and the third bit Q2 to the second internal input/output line (MIO<1>), sequentially transfer the sixth bit Q5 and the seventh bit Q6 to the third internal input/output line (MIO<2>), and sequentially transfer the fourth bit Q3 and the fifth bit Q4 to the fourth internal input/output line (MIO<3>). The output control circuit 330 may sort the consecutive bits to be positioned adjacent to each other according to the first and second read pulse signals RDP0 and RDP1 which are sequentially activated on every predetermined clock cycle. That is, the output control circuit 330 may sort the data (e.g., perform a prefetch operation) in the order of Q0, Q1, Q5, Q3, Q7, Q2, Q6, and Q4 so that consecutive bits are positioned adjacent to each other such that the series of bits of the data in the first order becomes four parallel series of bits, the bits within each of the parallel series being consecutive, thereby minimizing transitions of data transferred to the first to fourth internal input/output lines (MIO<0:3>). The parallel series transferred via the respective first to fourth internal input/output lines (MIO<0:3>) may be the parallel data MIO_A, MIO_B, MIO_C, MIO_D. A detailed configuration and operations of the output control circuit 330 are described below in detail with reference to FIGS. 13 and 14.

A data input/output operation of the so-configured stacked semiconductor device 110 is described below.

Upon a write operation, the first to third input buffers RX1 to RX3 of the base die 114 receive write data DIN in the first order, a write strobe signal WDQS, and a write inversion signal WDBI. The parallel circuit 210 of the base die 114 may receive the write data DIN in the first order, according to a write strobe signal WDQS, sort the data so that consecutive bits of the write data DIN are positioned adjacent to each other, and transfer the data to a first to fourth internal input/output line (MIO<0:3>). For example, the parallel circuit 210 may sort (e.g., perform a prefetch operation) the data in the order of Q0, Q1, Q5, Q3, Q7, Q2, Q6, and Q4 so that the consecutive bits of the write data DIN input in the first order from Q0 to Q7 are positioned adjacent to each other. The fourth output buffer TX4 may transfer the parallel data (MIO_A, MIO_B, MIO_C, MIO_D) output from the parallel circuit 210 to the through-electrodes TSV via the first to fourth internal input/output lines (MIO<0:3>), and the fifth output buffer TX5 may transfer the write inversion signal WDBI to the through-electrode TSV.

The fifth input buffer RX5 of the core die 112_x may buffer the parallel data (MIO_A, MIO_B, MIO_C, MIO_D) transferred from the through-electrodes TSV, and the input control circuit 310 may resort the parallel data (MIO_A, MIO_B, MIO_C, MIO_D) in the first order, according to the first to third write pulse signals WTP0 to WTP2. The write inversion circuit 320 may selectively invert the resorted data according to the write inversion signal WDBI and transfer the inverted data to the core global line CGIO so that target data is written to the memory area 300.

Upon a read operation, the output control circuit 330 of the core die 112_x may receive the data in the first order, which is provided via the core global line CGIO, according to the first and second read pulse signals RDP0 and RDP1 and sort the data so that consecutive bits of the data are positioned adjacent to each other. The sixth output buffer TX6 may transfer the parallel data (MIO_A, MIO_B, MIO_C, MIO_D) output from the output control circuit 330 to the first to fourth internal input/output lines (MIO<0:3>).

The fourth input buffer RX4 of the base die 114 may buffer the parallel data (MIO_A, MIO_B, MIO_C, MIO_D) transferred from the first to fourth internal input/output lines (MIO<0:3>). The serial circuit 230 may generate a read strobe signal RDQS based on a first clock signal RCLK and a second clock signal FCLK and convert the parallel data (MIO_A, MIO_B, MIO_C, MIO_D) into serial data SDOUT in the first order, based on the read strobe signal RDQS. The read inversion circuit 250 may generate a read inversion signal RDBI using the serial data SDOUT, selectively invert the serial data SDOUT according to the read inversion signal RDBI, and output read data DOUT in the first order. The first to third output buffers TX1 to TX3 may output the read data DOUT, read strobe signal RDQS, and read inversion signal RDBI to the DQ pad, DQS pad, and DBI pad, respectively.

As described above, upon data input/output operation between the semiconductor chips of the stacked semiconductor device, the transmit side may sort data bits so that consecutive data bits in an original order are positioned adjacent to each other such that the series of data bits becomes parallel series of bits, the bits within each of the parallel series being consecutive, and transfer the parallel series of bits to the respective internal input/output lines MIO, and the receive side may resort the parallel series of bits transferred via the respective internal input/output lines MIO to have the original order. Thus, it is possible to support a DBI function for the data transferred via the internal input/output lines MIO using a write inversion signal WDBI provided from the outside, thus reducing current consumption and noise.

A specific embodiment of each component as illustrated in FIG. 6 is described below with reference to the drawings.

Figure 7:
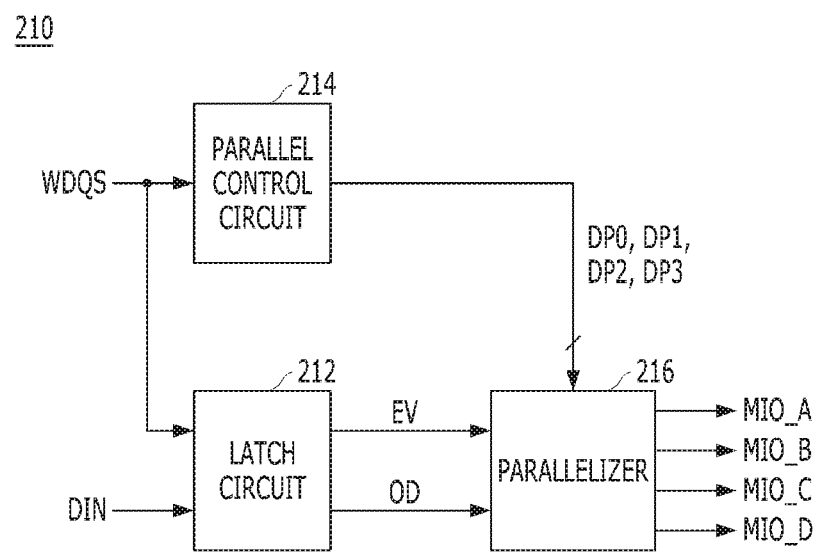
FIG. 7 is a block diagram illustrating a parallel circuit as illustrated in FIG. 6.

FIG. 7 is a block diagram illustrating a parallel circuit 210 as illustrated in FIG. 6.

Referring to FIG. 7, a parallel circuit 210 may include a latch circuit 212, a parallel control circuit 214, and a parallelizer 216.

The latch circuit 212 may latch write data DIN in response to a rising edge and falling edge of a write strobe signal WDQS to output first latch data EV and second latch data OD.

The parallel control circuit 214 may generate a first parallel pulse signal DP0 to a fourth parallel pulse signal DP3 which are sequentially activated on each cycle of the write strobe signal WDQS.

The parallelizer 216 may sort the first latch data EV and second latch data OD according to the first to fourth parallel pulse signals DP0 to DP3 to output parallel data (MIO_A, MIO_B, MIO_C, MIO_D). At this time, the parallelizer 216 may sort the bits included in each piece of the parallel data (MIO_A, MIO_B, MIO_C, MIO_D) to be positioned adjacent to each other.

Figure 8:
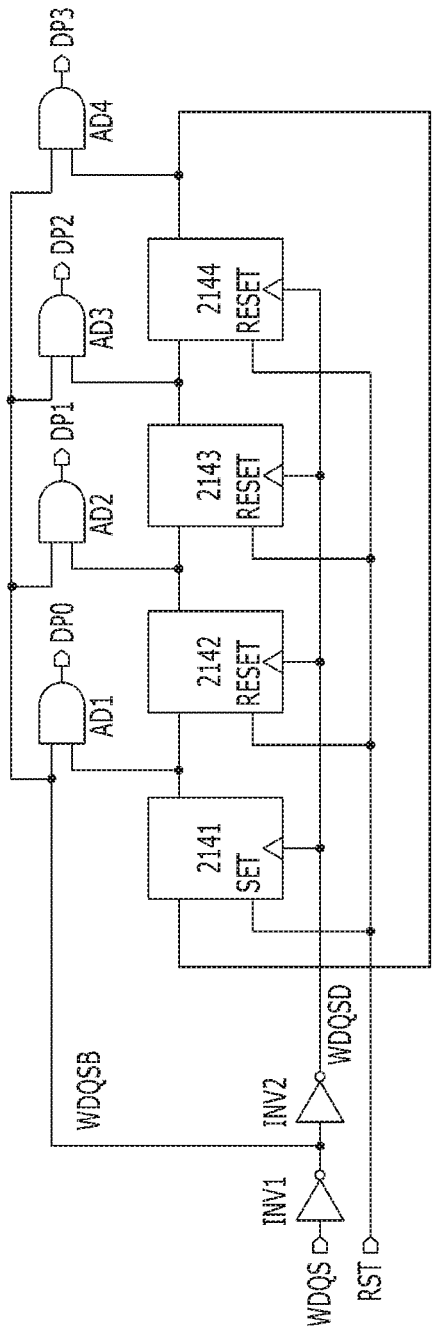
FIG. 8 is a circuit diagram illustrating a parallel control circuit as illustrated in FIG. 7.

FIG. 8 is a circuit diagram illustrating a parallel control circuit 214 as illustrated in FIG. 7.

Referring to FIG. 8, the parallel control circuit 214 may include a first inverter INV1 and a second inverter INV2, a first flip flop 2141 to a fourth flip flop 2144, and a first AND gate AD1 to a fourth AND gate AD4.

The first inverter INV1 may invert a write strobe signal WDQS to thereby generate an inverted strobe signal WDQSB. The second inverter INV2 may invert the inverted strobe signal WDQSB to thereby generate a buffered strobe signal WDQSD.

The first to fourth flip flops 2141 to 2144 may receive the buffered strobe signal WDQSD as a clock signal and may be serially connected in a ring structure in which the output from the fourth flip flop 2144 is provided as an input to the first flip flop 2141. The first flip flop 2141 may be set according to a reset signal RST. The second to fourth flip flops 2142 to 2144 may be reset according to the reset signal RST. For example, when the reset signal RST is activated, the first flip flop 2141 may output a logic high level signal, and the second to fourth flip flops 2142 to 2144 may output logic low level signals. Thereafter, the first to fourth flip flops 2141 to 2144 may sequentially output logic high level signals as the write strobe signal WDQS is toggled.

The first to fourth AND gates AD1 to AD4 may be operatively coupled to the first to fourth flip flops 2141 to 2144, respectively, and perform a logic AND operation on the inverted strobe signal WDQSB and the outputs from their respective corresponding flip flops, generating the first to fourth parallel pulse signals DP0 to DP3. That is, the first to fourth AND gates AD1 to AD4 may output the outputs from the first to fourth flip flops 2141 to 2144, as the first to fourth parallel pulse signals DP0 to DP3, during the low period of the write strobe signal WDQS.

Figure 9:
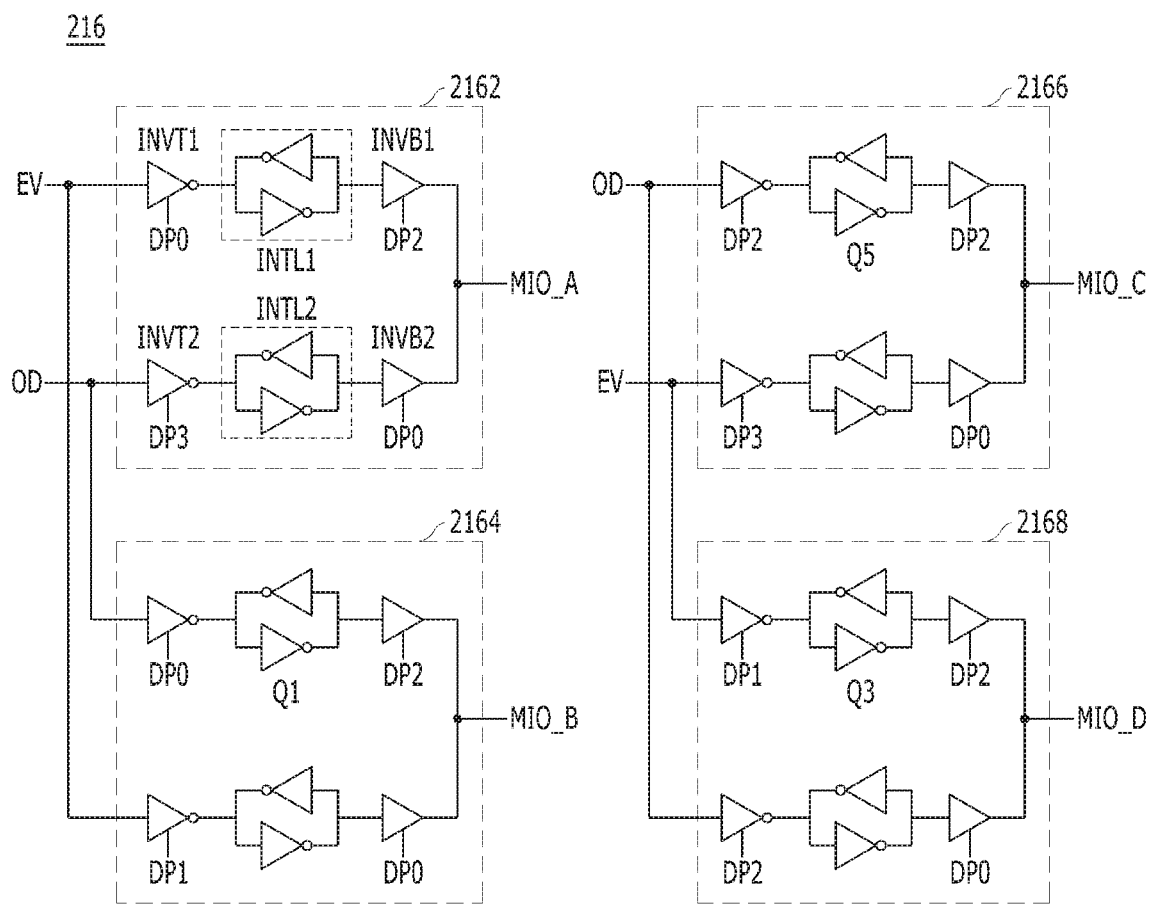
FIG. 9 is a circuit diagram illustrating a parallelizer as illustrated in FIG. 7.

FIG. 9 is a detailed circuit diagram illustrating a parallelizer 216 as illustrated in FIG. 7.

Referring to FIG. 9, the parallelizer 216 may include first to fourth sorting circuits 2162, 2164, 2166, and 2168.

The first sorting circuit 2162 may latch the first latch data EV according to the first parallel pulse signal DP0 and output data latched according to the third parallel pulse signal DP2, as the parallel data MIO_A of the first internal input/output line (MIO<0>). The first sorting circuit 2162 may latch the second latch data OD according to the fourth parallel pulse signal DP3 and output data latched according to the first parallel pulse signal DP0, as the parallel data MIO_A of the first internal input/output line (MIO<0>).

The second sorting circuit 2164 may latch the second latch data OD according to the first parallel pulse signal DP0 and output data latched according to the third parallel pulse signal DP2, as the parallel data MIO_B of the second internal input/output line (MIO<1>). The second sorting circuit 2164 may latch the first latch data EV according to the second parallel pulse signal DP1 and output data latched according to the first parallel pulse signal DP0, as the parallel data MIO_B of the second internal input/output line (MIO<1>).

The third sorting circuit 2166 may latch the second latch data OD according to the third parallel pulse signal DP2 and output the data latched according to the third parallel pulse signal DP2, as the parallel data MIO_C of the third internal input/output line (MIO<2>). The third sorting circuit 2166 may latch the first latch data EV according to the fourth parallel pulse signal DP3 and output data latched according to the first parallel pulse signal DP0, as the parallel data MIO_C of the third internal input/output line (MIO<2>).

The fourth sorting circuit 2168 may latch the first latch data EV according to the second parallel pulse signal DP1 and output data latched according to the third parallel pulse signal DP2, as the parallel data MIO_D of the fourth internal input/output line (MIO<3>). The fourth sorting circuit 2168 may latch the second latch data OD according to the third parallel pulse signal DP2 and output data latched according to the first parallel pulse signal DP0, as the parallel data MIO_D of the fourth internal input/output line (MIO<3>).

The first to fourth sorting circuits 2162 to 2168 have substantially the same configuration except for input/output signals. Thus, a configuration of the first sorting circuit 2162 is described below.

The first sorting circuit 2162 may include first and second three-phase inverters INVT1 and INVT2, first and second inverter latches INVL1 and INVL2, and first and second buffers INVB1, INVB2.

The first three-phase inverter INVT1 may invert the first latch data EV when the first parallel pulse signal DP0 is activated. The first inverter latch INVL1 may invert the output from the first three-phase inverter INVT1 and latch the inverted output. The first buffer INVB1 may output the output from the first inverter latch INVL1 to the parallel data MIO_A when the third parallel pulse signal DP2 is activated. The second three-phase inverter INVT2 may invert the second latch data OD when the fourth parallel pulse signal DP3 is activated. The second inverter latch INVL2 may invert the output from the second three-phase inverter INVT2 and latch the inverted output. The second buffer INVB2 may output the output from the second inverter latch INVL2 to the parallel data MIO_A when the first parallel pulse signal DP0 is activated.

Operations of the parallel circuit 210 are described below with reference to FIGS. 7 to 10.

Figure 10:
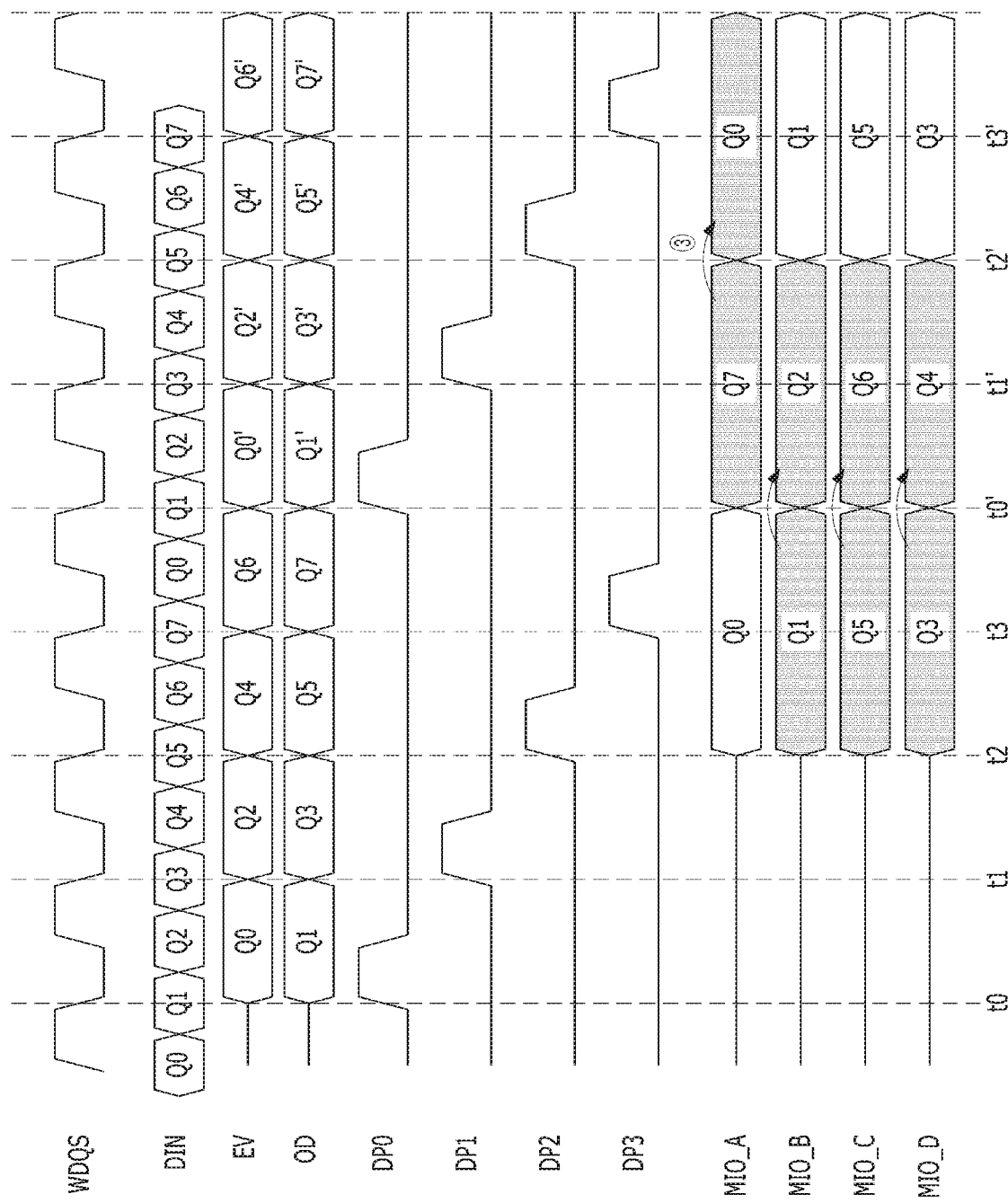
FIG. 10 is a waveform diagram illustrating an operation of a parallel circuit as illustrated in FIG. 7.

FIG. 10 is a waveform diagram illustrating an operation of a parallel circuit 210 as illustrated in FIG. 7.

Referring to FIG. 10, when eight-bit write data DIN is serially input in the order from Q0 to Q7, the latch circuit 212 latches the write data DIN in response to a rising edge of a write strobe signal WDQS to output first latch data EV of Q0, Q2, Q4, and Q6 and latches the write data DIN in response to a falling edge to output second latch data OD of Q1, Q3, Q5, and Q7. The parallel control circuit 214 generates a first parallel pulse signal DP0 to a fourth parallel pulse signal DP3 which are sequentially activated in the low period of the write strobe signal WDQS.

The first sorting circuit 2162 may latch the first latch data EV according to the first parallel pulse signal DP0, latch the second latch data OD according to the fourth parallel pulse signal DP3, and sequentially output data Q0 and Q7 latched according to the third parallel pulse signal DP2 and the first parallel pulse signal DP0, as the parallel data MIO_A. Likewise, the second sorting circuit 2164 may latch the second latch data OD according to the first parallel pulse signal DP0, latch the first latch data EV according to the second parallel pulse signal DP1, and sequentially output data Q1 and Q2 latched according to the third parallel pulse signal DP2 and the first parallel pulse signal DP0, as the parallel data MIO_B.

As described above, where eight-bit write data DIN is serially input in the first order from the first bit Q0 to the eighth bit Q7, the parallel circuit 210 may sequentially transfer the first bit Q0 and the eighth bit Q7 to the first internal input/output line (MIO<0>), sequentially transfer the second bit Q1 and the third bit Q2 to the second internal input/output line (MIO<1>), sequentially transfer the sixth bit Q5 and the seventh bit Q6 to the third internal input/output line (MIO<2>), and sequentially transfer the fourth bit Q3 and the fifth bit Q4 to the fourth internal input/output line (MIO<3>).

Thus, while the data input/output operation of FIG. 5 is performed in the direction; from Qn to Qn+4 (where n=0, 1, 2, and 3) for the data transferred via the internal input/output line MIO, the data input/output operation according to an embodiment allows the series of bits Q0 to Q7 of the data to be transferred via the internal input/output line MIO to be sorted in the order of Q0, Q1, Q5, Q3, Q7, Q2, Q6, and Q4 so that consecutive bits are positioned adjacent to each other. Hence, according to an embodiment, the direction of computation on the inversion signal DBI is considerably identical to the actual input/output direction @ of the data transferred via the internal input/output line MIO and, thus, the DBI function may be effectively applied to reduce current consumption.

Although it has been described in connection with FIGS. 7 to 10 that Q0 and Q7, Q1 and Q2, Q5 and Q6, and Q3 and Q4 are sequentially output to the first to fourth internal input/output lines (MIO<0:3>), embodiments of the disclosure are not limited thereto. According to an embodiment, various methods may be used that sort consecutive bits of the write data DIN to be positioned adjacent to each other and sequentially output the same to the first to fourth internal input/output lines (MIO<0:3>). For example, where eight-bit write data DIN is serially input in the first order from the first bit Q0 to the eighth bit Q7, the parallel circuit 210 may sequentially transfer the first bit Q0 and the eighth bit Q7 to the first internal input/output line (MIO<0>), sequentially transfer the second bit Q1 and the third bit Q2 to the second internal input/output line (MIO<1>), sequentially transfer the fourth bit Q3 and the fifth bit Q4 to the third internal input/output line (MIO<2>), and sequentially transfer the sixth bit Q5 and the seventh bit Q6 to the fourth internal input/output line (MIO<3>).

Figure 11:
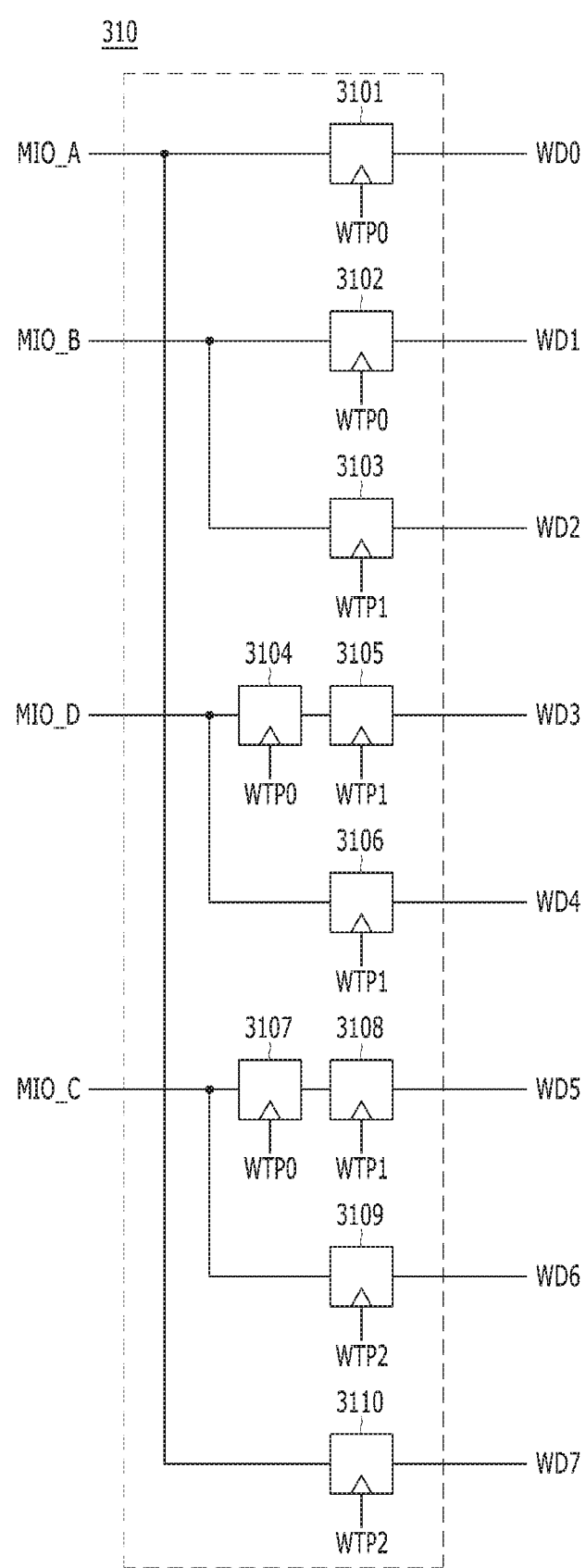
FIG. 11 is a circuit diagram illustrating an input control circuit as illustrated in FIG. 6.

FIG. 11 is a detailed circuit diagram illustrating an input control circuit 310 as illustrated in FIG. 6.

Referring to FIG. 11, the input control circuit 310 may include a first flip flop 3101 to a tenth flip flop 3110.

The first flip flop 3101 may latch the parallel data MIO_A according to the first write pulse signal WTP0 and output the latched data as first data WD0. The second flip flop 3102 may latch the parallel data MIO_B according to the first write pulse signal WTP0 and output the latched data as second data WD1. The third flip flop 3103 may latch the parallel data MIO_B according to the second write pulse signal WTP1 and output the latched data as third data WD2. The fourth flip flop 3104 may latch the parallel data MIO_D according to the first write pulse signal WTP0. The fifth flip flop 3105 may re-latch the output from the fourth flip flop 3104 according to the second write pulse signal WTP1 and output the same as fourth data WD3. The sixth flip flop 3106 may latch the parallel data MIO_D according to the second write pulse signal WTP1 and output the latched data as fifth data WD4. The seventh flip flop 3107 may latch the parallel data MIO_C according to the first write pulse signal WTP0. The eighth flip flop 3108 may re-latch the output from the seventh flip flop 3107 according to the second write pulse signal WTP1 and output the same as sixth data WD5. The ninth flip flop 3109 may latch the parallel data MIO_C according to the third write pulse signal WTP2 and output the latched data as seventh data WD6. The tenth flip flop 3110 may latch the parallel data MIO_A according to the third write pulse signal WTP2 and output the latched data as eighth data WD7.

Figure 12:
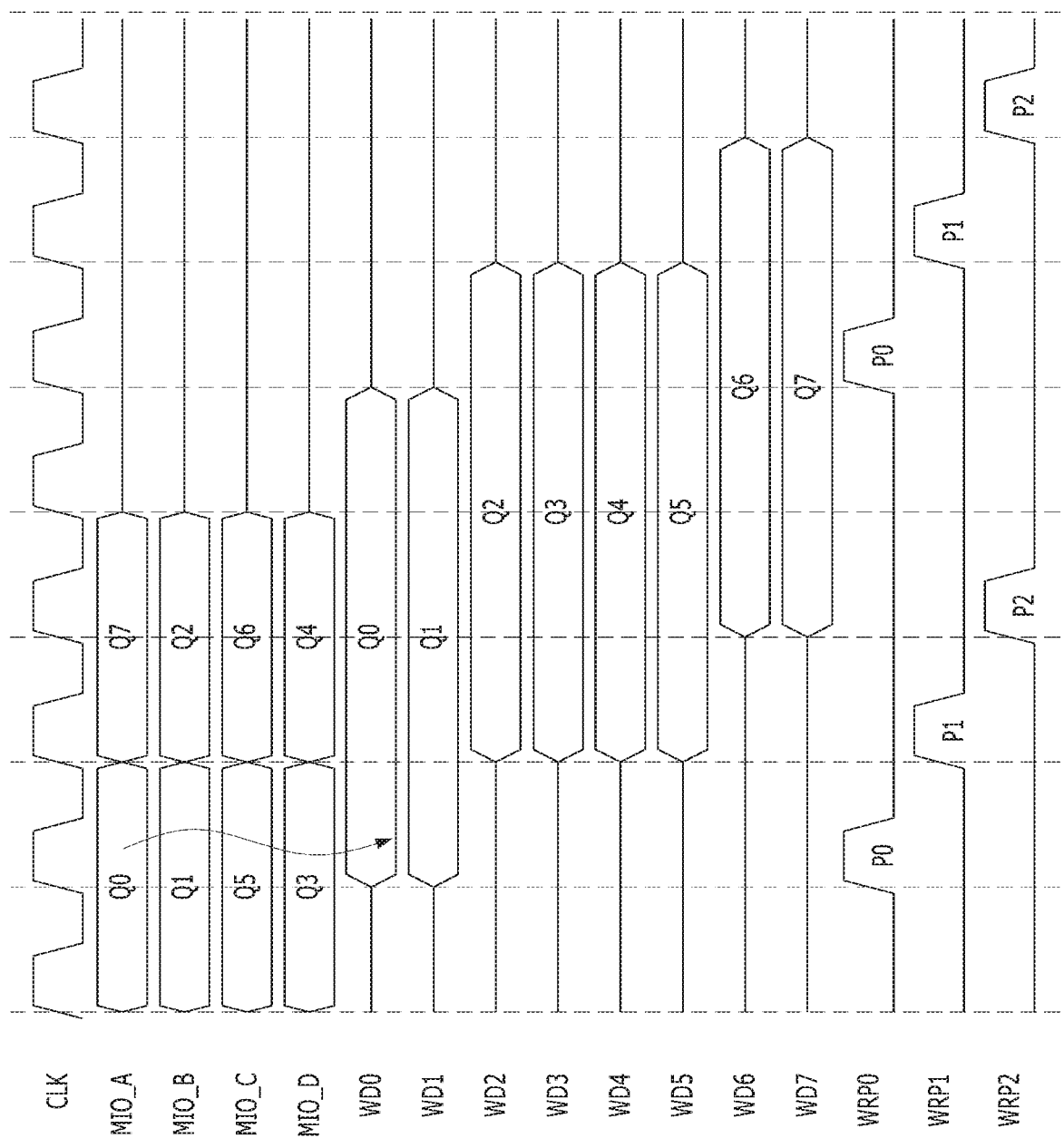
FIG. 12 is a waveform diagram illustrating an operation of an input control circuit as illustrated in FIG. 11.

FIG. 12 is a waveform diagram illustrating an operation of an input control circuit 310 as illustrated in FIG. 11.

Referring to FIG. 12, a first write pulse signal WTP0 to a third write pulse signal WTP2 are sequentially activated in the high period of the clock CLK.

The input control circuit 310 may receive parallel data (MIO_A, MIO_B, MIO_C, MIO_D), output first data WD0 and second data WD1 according to the first write pulse signal WTP0, third data WD2 and fifth data WD4 according to the second write pulse signal WTP1, and seventh data WD6 and eighth data WD7 according to the third write pulse signal WTP2. The input control circuit 310 may output fourth data WD3 and sixth data WD5 according to the first and second write pulse signals WTP0 and WTP1. Resultantly, the input control circuit 310 may receive the parallel data (MIO_A, MIO_B, MIO_C, MIO_D) and sort the data in the first order.

Figure 13:
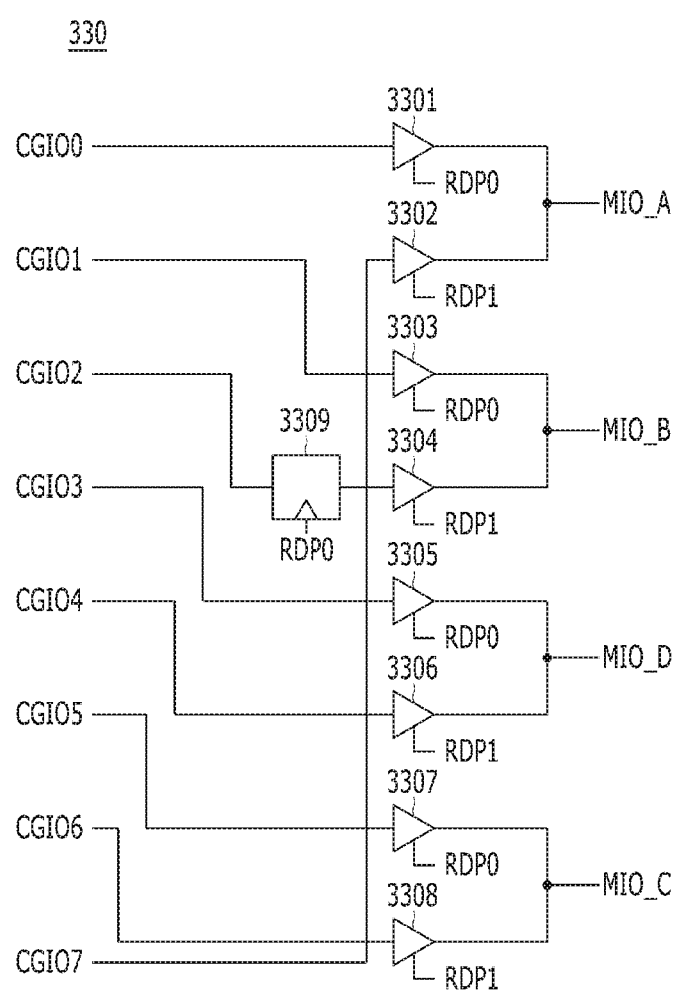
FIG. 13 is a circuit diagram illustrating an output control circuit as illustrated in FIG. 6.

FIG. 13 is a detailed circuit diagram illustrating an output control circuit 330 as illustrated in FIG. 6.

Referring to FIG. 13, the output control circuit 330 may include a first output driver 3301 to an eighth output driver 3308 and a flip flop 3309.

In FIG. 13, data from the core global line CGIO includes a first bit CGIO0 to an eighth bit CGIO7.

The first output driver 3301 may drive the first bit CGIO0 to the parallel data MIO_A according to the first read pulse signal RDP0, and the second output driver 3302 may drive the eighth bit CGIO7 to the parallel data MIO_A according to the second read pulse signal RDP1.

The flip flop 3309 may latch the third bit CGIO2 according to the first read pulse signal RDP0. The third output driver 3303 may drive the second bit CGIO1 to the parallel data MIO_B according to the first read pulse signal RDP0, and the fourth output driver 3304 may drive the output from the flip flop 3309 to the parallel data MIO_B according to the second read pulse signal RDP1.

The fifth output driver 3305 may drive the fourth bit CGIO3 to the parallel data MIO_D according to the first read pulse signal RDP0, and the sixth output driver 3306 may drive the fifth bit CGIO4 to the parallel data MIO_D according to the second read pulse signal RDP1.

The seventh output driver 3307 may drive the sixth bit CGIO5 to the parallel data MIO_C according to the first read pulse signal RDP0, and the eighth output driver 3308 may drive the seventh bit CGIO6 to the parallel data MIO_C according to the second read pulse signal RDP1.

Figure 14:
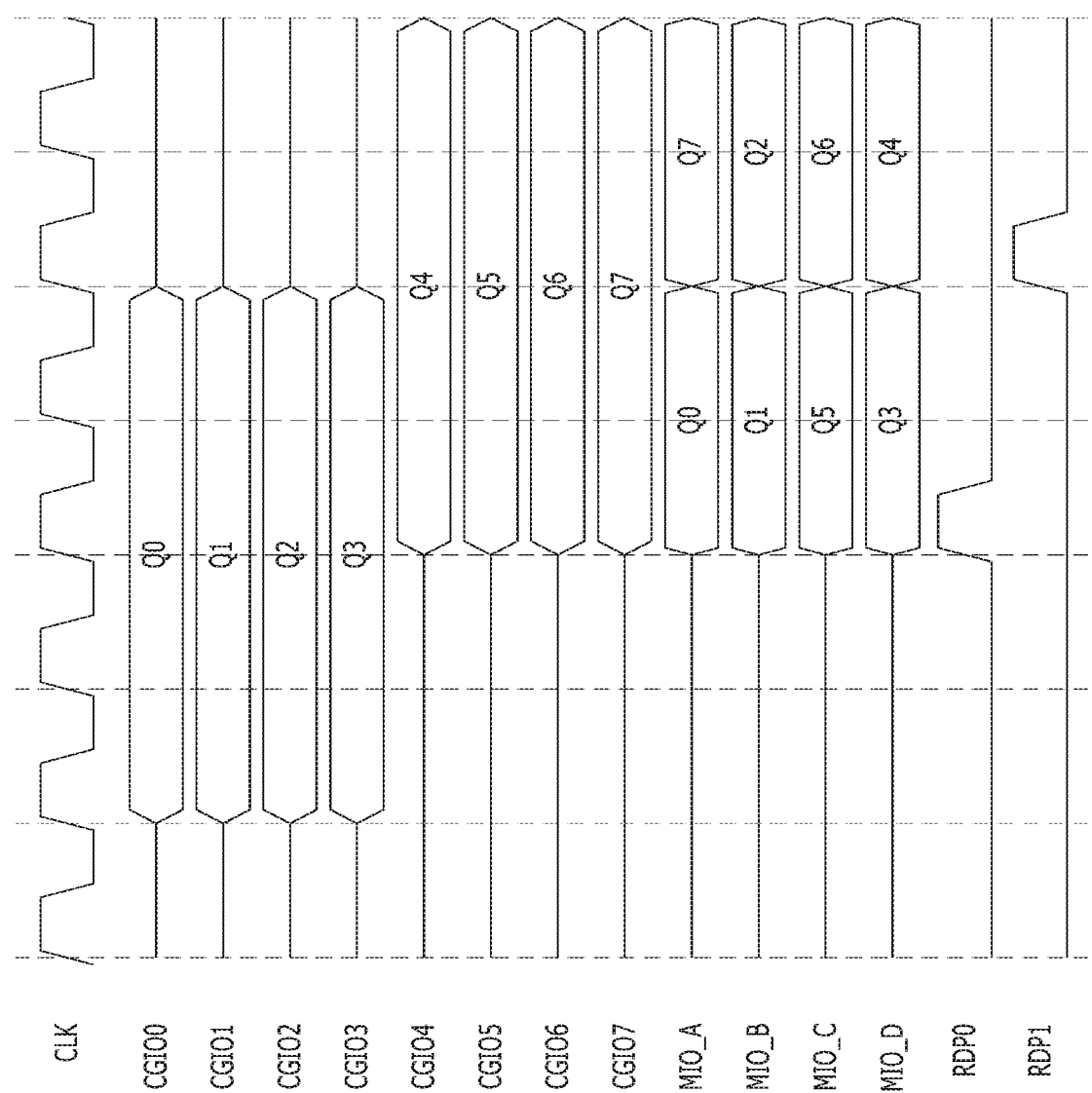
FIG. 14 is a waveform diagram illustrating an operation of an output control circuit as illustrated in FIG. 13.

FIG. 14 is a waveform diagram illustrating an operation of an output control circuit 330 as illustrated in FIG. 13.

Referring to FIG. 14, the first to fourth bits CGIO0 to CGIO3 of Q1, Q2, Q3, and Q4 of the core global line CGIO are output at predetermined times of the clock CLK, and the fifth to eighth bits CGIO4 to CGIO7 of Q5, Q6, Q7, and Q8 of the core global line CGIO are output two clock (CLK) cycles after the predetermined times. The first and second read pulse signals RDP0 and RDP1 are sequentially activated on every two clock (CLK) cycles in the high periods of the clock CLK.

The output control circuit 330 may sequentially output the first bit CGIO0 of Q0 and the eighth bit CGIO7 of Q7, as the parallel data MIO_A, according to the first and second read pulse signals RDP0 and RDP1. The output control circuit 330 may latch the third bit CGIO2 of Q2 according to the first read pulse signal RDP0 and sequentially output the second bit CGIO1 of Q1 and the latched data Q2, as the parallel data MIO_B, according to the first and second read pulse signals RDP0 and RDP1. The output control circuit 330 may sequentially output the fourth bit CGIO3 of Q3 and the fifth bit CGIO4 of Q4, as the parallel data MIO_D, according to the first and second read pulse signals RDP0 and RDP1. The output control circuit 330 may sequentially output the sixth bit CGIO5 of Q5 and the seventh bit CGIO6 of Q6, as the parallel data MIO_C, according to the first and second read pulse signals RDP0 and RDP1.

The output control circuit 330 may receive the data in the first order, which is provided via the core global line CGIO, and sort the data so that consecutive bits are positioned adjacent to each other, and output the resultant data as the parallel data (MIO_A, MIO_B, MIO_C, MIO_D).

Although it has been described in connection with FIGS. 13 to 14 that the output control circuit 330 sequentially outputs Q0 and Q7, Q1 and Q2, Q5 and Q6, and Q3 and Q4 of the core global line CGIO to the first to fourth internal input/output lines (MIO<0:3>), embodiments of the disclosure are not limited thereto. According to an embodiment, the output control circuit 330 may sequentially transfer Q0 and Q7 to the first internal input/output line (MIO<0>), sequentially transfer Q1 and Q2 to the second internal input/output line (MIO<1>), sequentially transfer Q3 and Q4 to the third internal input/output line (MIO<2>), and sequentially transfer Q5 and Q6 to the fourth internal input/output line (MIO<3>).

Figure 15:
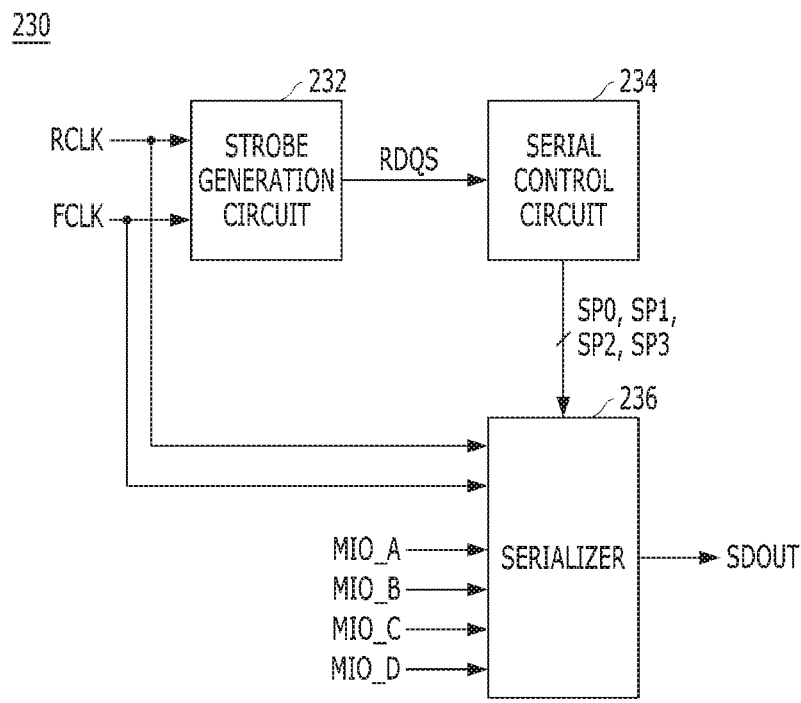
FIG. 15 is a block diagram illustrating a serial circuit as illustrated in FIG. 6.

FIG. 15 is a block diagram illustrating a serial circuit 230 as illustrated in FIG. 6.

Referring to FIG. 15, the serial circuit 230 may include a strobe generation circuit 232, a serial control circuit 234, and a serializer 236.

The strobe generation circuit 232 may generate a read strobe signal RDQS based on a first clock signal RCLK and a second clock signal FCLK. The read strobe signal RDQS may have the same phase as the first clock signal RCLK.

The serial control circuit 234 may generate a first serial pulse signal SP0 to a fourth serial pulse signal SP3 which are sequentially activated on each cycle of the read strobe signal RDQS. The serial control circuit 234 may generate a first serial pulse signal SP0 to a fourth serial pulse signal SP3 which are sequentially activated in the high period of the read strobe signal RDQS. The serial control circuit 234 may have substantially the same configuration as the parallel control circuit 214 described above in connection with FIG. 8 except that a buffered strobe signal is input to each AND gate AD1 to AD4.

The serializer 236 may serialize the parallel data (MIO_A, MIO_B, MIO_C, MIO_D) into serial data SDOUT in the first order, according to the first to fourth serial pulse signals SP0 to SP3.

Figure 16:
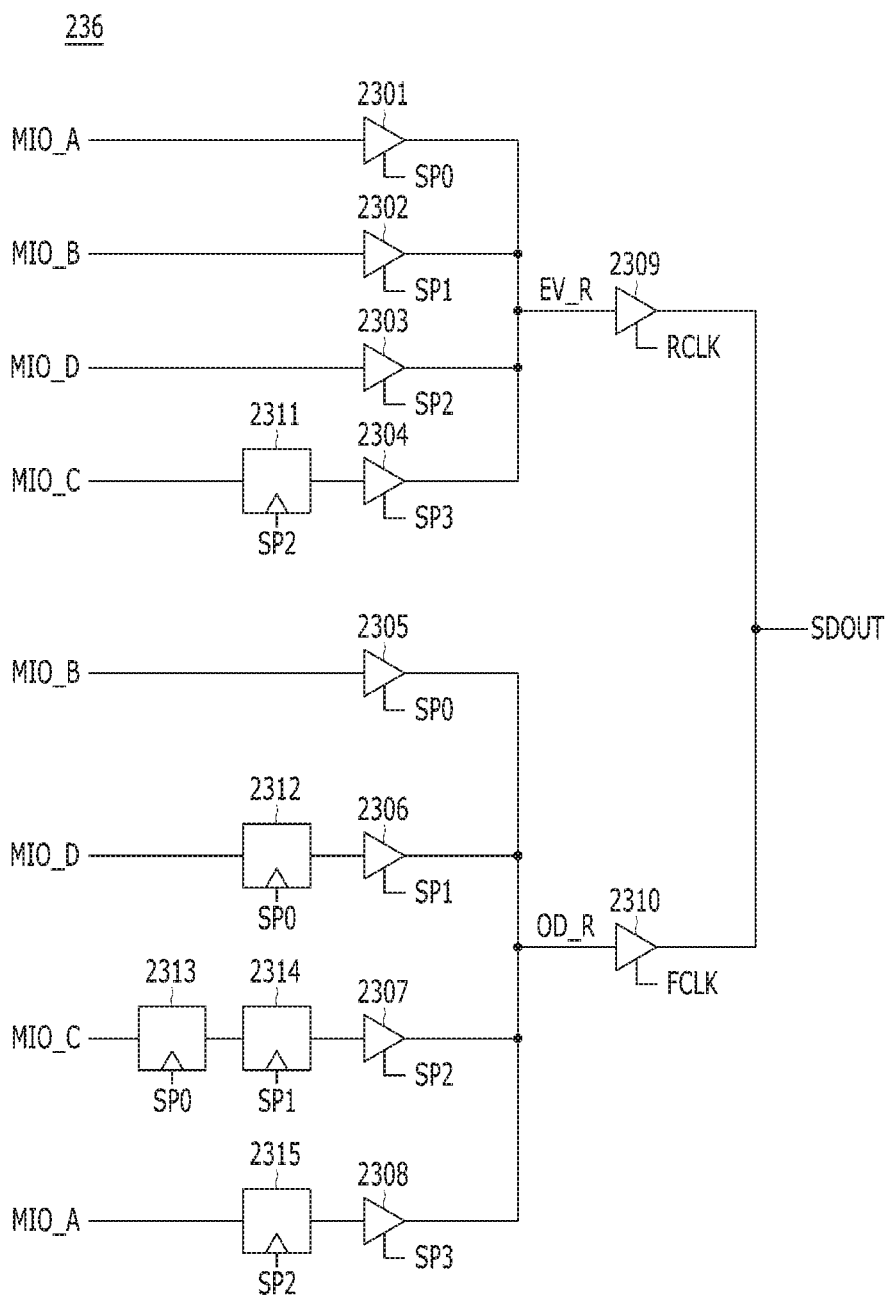
FIG. 16 is a circuit diagram illustrating a serializer as illustrated in FIG. 15.

FIG. 16 is a circuit diagram illustrating a serializer 236 as illustrated in FIG. 15.

Referring to FIG. 16, the serializer 236 may include a first output driver 2301 to a tenth output driver 2310 and a first flip flop 2311 to a fifth flip flop 2315.

The first flip flop 2311 may latch the parallel data MIO_C according to the third serial pulse signal SP2. The second flip flop 2312 may latch the parallel data MIO_D according to the first serial pulse signal SP0. The third flip flop 2313 may latch the parallel data MIO_C according to the first serial pulse signal SP0. The fourth flip flop 2314 may latch the output from the third flip flop 2313 according to the second serial pulse signal SP1. The fifth flip flop 2315 may latch the parallel data MIO_A according to the third serial pulse signal SP2.

The first output driver 2301 may drive a first node EV_R to the parallel data MIO_A according to the first serial pulse signal SP0. The second output driver 2302 may drive the first node EV_R to the parallel data MIO_B according to the second serial pulse signal SP1. The third output driver 2303 may drive the first node EV_R to the parallel data MIO_D according to the third serial pulse signal SP2. The fourth output driver 2304 may drive the first node EV_R to the output of the first flip flop 2311 according to the fourth serial pulse signal SP3.

The fifth output driver 2305 may drive a second node OD_R to the parallel data MIO_B according to the first serial pulse signal SP0. The sixth output driver 2306 may drive the second node OD_R to the output of the second flip flop 2312 according to the second serial pulse signal SP1. The seventh output driver 2307 may drive the second node OD_R to the output of the fourth flip flop 2314 according to the third serial pulse signal SP2. The eighth output driver 2308 may drive the second node OD_R to the output of the fifth flip flop 2315 according to the fourth serial pulse signal SP3.

The ninth output driver 2309 may drive the output end with the signal of the first node EV_R according to the first clock signal RCLK, and the tenth output driver 2310 may drive the output end with the signal of the second node OD_R according to the second clock signal FCLK. Finally, serial data SDOUT may be output from the output end.

Operations of the serial circuit 230 are described below with reference to FIGS. 15 to 17.

Figure 17:
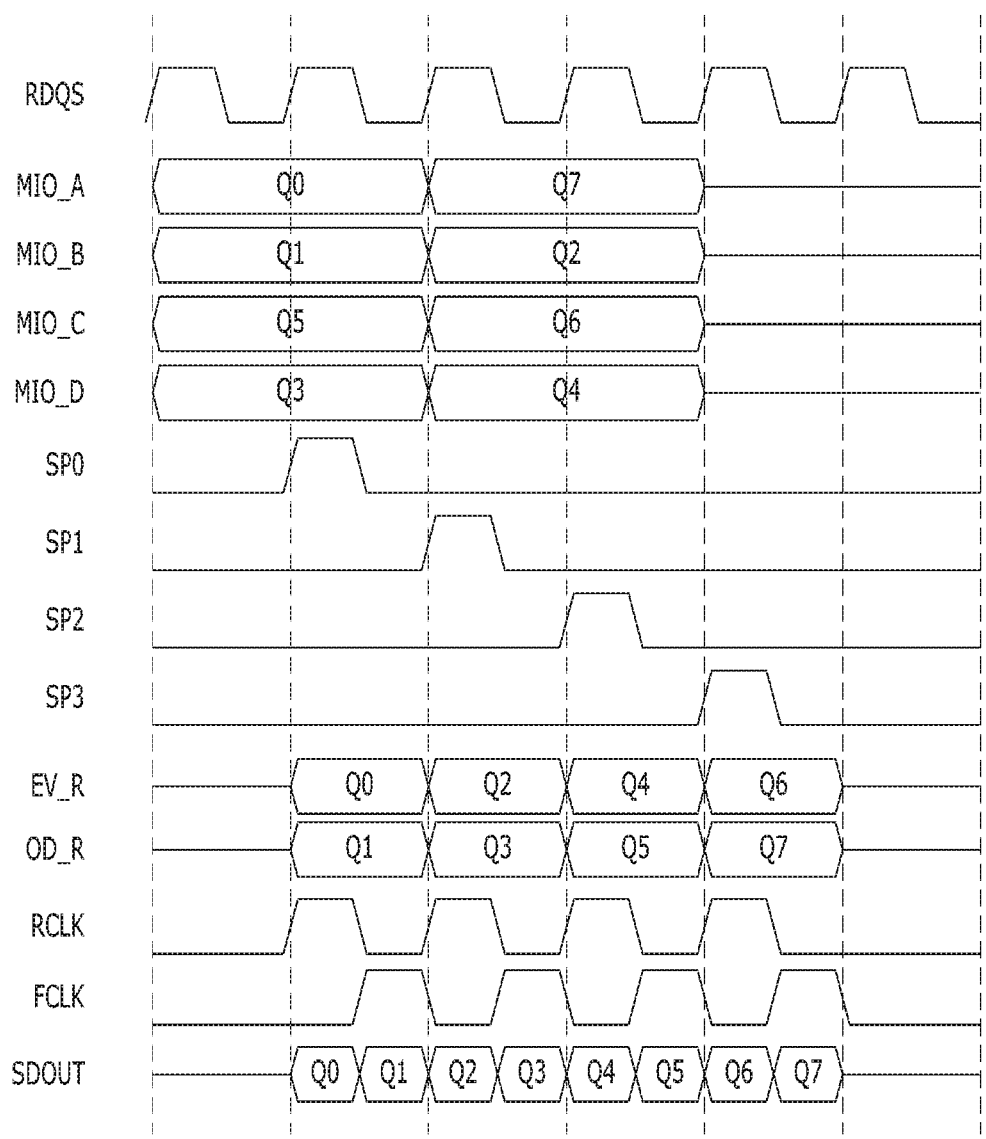
FIG. 17 is a waveform diagram illustrating an operation of a serial circuit as illustrated in FIG. 15.

FIG. 17 is a waveform diagram illustrating an operation of a serial circuit 230 as illustrated in FIG. 15.

Referring to FIG. 17, the parallel data MIO_A of Q0 and Q7 may be sequentially input via the first internal input/output line (MIO<0>), the parallel data MIO_B of Q1 and Q2 may be sequentially input via the second internal input/output line (MIO<1>), the parallel data MIO_C of Q5 and Q6 may be sequentially input via the third internal input/output line (MIO<2>), and the parallel data MIO_D of Q3 and Q4 may be sequentially input via the fourth internal input/output line (MIO<3>).

The strobe generation circuit 232 may generate a read strobe signal RDQS based on a first clock signal RCLK and a second clock signal FCLK. The serial control circuit 234 may generate a first serial pulse signal SP0 to a fourth serial pulse signal SP3 which are sequentially activated in the high period of the read strobe signal RDQS.

The serializer 236 may drive the first node EV_R and the second node OD_R to Q0 and Q1 of the parallel data MIO_A and MIO_B, respectively, according to the first serial pulse signal SP0 and sequentially output the signals Q0 and Q1 of the first node EV_R and the second node OD_R, as serial data SDOUT, according to the first clock signal RCLK and the second clock signal FCLK. The serializer 236 may latch Q3 of the parallel data MIO_D according to the first serial pulse signal SP0, drive the first node EV_R and the second node OD_R with Q2 of the parallel data MIO_B and the latched Q3, respectively, according to the second serial pulse signal SP1, and sequentially output the signals Q2 and Q3 of the first node EV_R and the second node OD_R, as the serial data SDOUT, according to the first clock signal RCLK and the second clock signal FCLK. In such a manner, the serializer 236 may output the serial data SDOUT in the first order from Q0 to Q7.

As described above, the serial circuit 230 may convert the parallel data (MIO_A, MIO_B, MIO_C, MIO_D) input in the order of Q0, Q1, Q5, Q3, Q7, Q2, Q6, and Q4 via the first to fourth internal input/output lines (MIO<0:3>) into serial data SDOUT in the first order from Q0 to Q7.

Although a four bit prefetch scheme-applied data input/output operation has been described above according to an embodiment, embodiments of the disclosure are not limited thereto.

Figure 18:
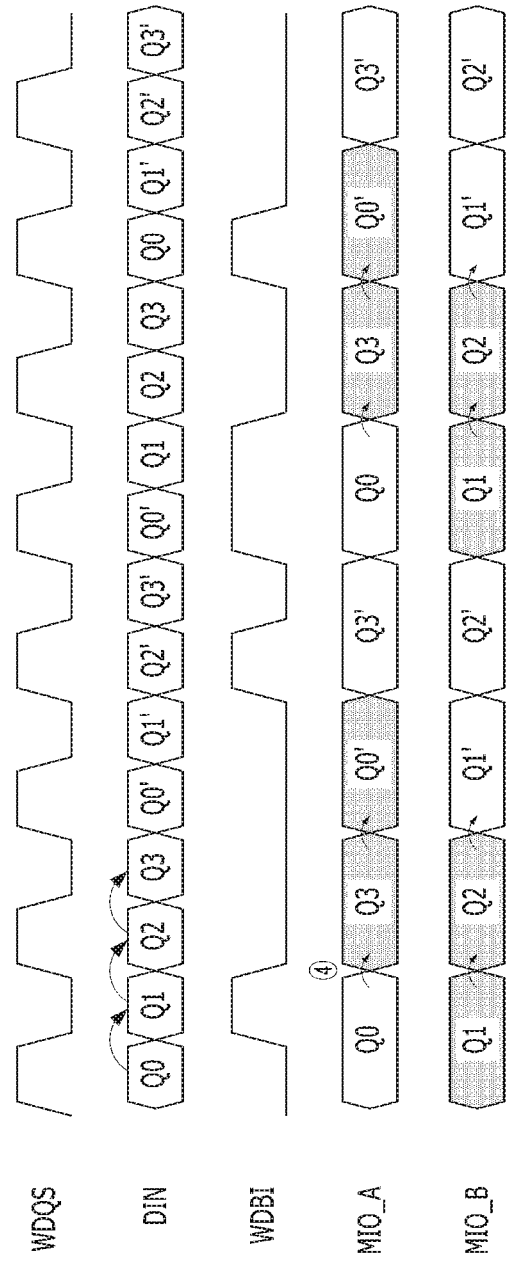
FIG. 18 is a waveform diagram illustrating a data input/output operation of a stacked semiconductor device according to another embodiment of the present disclosure.

FIG. 18 is a waveform diagram illustrating a data input/output operation of a stacked semiconductor device according to another embodiment of the disclosure.

FIG. 18 illustrates a two bit prefetch scheme-applied data input/output operation.

When four-bit write data DIN is serially input via one DQ pad in the first order from Q0 to Q3 upon a write operation, the parallel circuit of the base die may sort consecutive bits of the write data DIN to be positioned adjacent to each other and transfer the bits to the first and second internal input/output line (MIO<0:1>), respectively. For example, the parallel circuit may sequentially transfer the first bit Q0 and the fourth bit Q3 as the parallel data MIO_A of the first internal input/output line (MIO<0>) and sequentially transfer the second bit Q1 and the third bit Q2 as the parallel data MIO_B of the second internal input/output line (MIO<1>).

Upon a read operation, the output control circuit of the core die may sequentially transfer the first bit Q0 and the fourth bit Q3 of the core global line CGIO as the parallel data MIO_A of the first internal input/output line (MIO<0>) and sequentially transfer the second bit Q1 and the third bit Q2 as the parallel data MIO_B of the second internal input/output line (MIO<1>).

Thus, the data input/output operation according to an embodiment allows the data transferred via the internal input/output lines MIO to be sorted in the order of Q0, Q1, Q3, and Q2 so that consecutive bits are positioned adjacent to each other. Hence, according to an embodiment, the direction of computation on the inversion signal DBI is considerably identical to the actual input/output direction ( ) of the data transferred via the internal input/output line MIO and, thus, the DBI function may be effectively applied to reduce current consumption.

It should be noted that although the technical spirit of the present invention has been described in connection with preferred embodiments thereof, this is merely for description purposes and should not be interpreted as limiting. It should be appreciated by one of ordinary skill in the art that various changes may be made thereto without departing from the technical spirit of the present invention.

For example, for the logic gates and transistors provided as examples in the above-described embodiments, different positions and types may be implemented depending on the polarity of the input signal.

While the present disclosure has been described with respect to specific embodiments, it will be apparent to those skilled in the art that various changes and modifications may be made without departing from the spirit and scope of the disclosure as defined in the following claims.

What is claimed is:

1. A stacked semiconductor device, comprising:
   a base die including an input buffer and a parallel circuit; and
   a plurality of core dies stacked over the base die, the plurality of core dies being coupled to the base die through a plurality of through-electrodes,
   wherein the input buffer is configured to receive write data in a first order and a write inversion signal,
   wherein the parallel circuit is configured to sort consecutive bits of the write data to be positioned adjacent to each other so that the write data becomes first parallel data and to transfer the first parallel data to respective first to n-th internal input/output lines, where n is an integer greater than or equal to 2, and wherein each of the plurality of core dies includes an input control circuit configured to re-sort the first parallel data transferred via the respective first to n-th internal input/output lines into the write data and a write inversion circuit configured to selectively invert the re-sorted write data according to the write inversion signal.

2. The stacked semiconductor device of claim 1, wherein the parallel circuit includes:
a latch circuit for latching the write data in response to a rising edge and a falling edge of a write strobe signal and outputting first latch data and second latch data;
a parallel control circuit for generating a plurality of parallel pulse signals sequentially activated on each predetermined cycle of the write strobe signal; and
a parallelizer for sorting the first latch data and the second latch data according to the parallel pulse signals and transferring the sorted first latch data and second latch data to the respective first to n-th internal input/output lines.

3. The stacked semiconductor device of claim 1, wherein, when the write data is input in the first order from a first bit to an eighth bit, the parallel circuit sorts the consecutive bits and transfers the first parallel data by sequentially transferring the first bit and the eighth bit to the first internal input/output line, sequentially transferring the second bit and the third bit to the second internal input/output line, sequentially transferring the sixth bit and the seventh bit to the third internal input/output line, and sequentially transferring the fourth bit and the fifth bit to the fourth internal input/output line.

4. The stacked semiconductor device of claim 1, wherein, when the write data is input in the first order from a first bit to an eighth bit, the parallel circuit sorts the consecutive bits and transfers the first parallel data by sequentially transferring the first bit and the eighth bit to the first internal input/output line, sequentially transferring the second bit and the third bit to the second internal input/output line, sequentially transferring the fourth bit and the fifth bit to the third internal input/output line, and sequentially transferring the sixth bit and the seventh bit to the fourth internal input/output line.

5. The stacked semiconductor device of claim 1, wherein, when the write data is input in the first order from a first bit to a fourth bit, the parallel circuit sorts the consecutive bits and transfers the first parallel data by sequentially transferring the first bit and the fourth bit to the first internal input/output line and sequentially transferring the second bit and the third bit to the second internal input/output line.

6. The stacked semiconductor device of claim 1, wherein each of the plurality of core dies includes:
the input control circuit for re-sorting the first parallel data into the write data according to a plurality of write pulse signals sequentially activated;
the write inversion circuit for selectively inverting the re-sorted write data according to the write inversion signal and transferring the re-sorted write data to a core global line; and
a memory area where the re-sorted write data transferred to the core global line is written.

7. The stacked semiconductor device of claim 1, wherein each of the plurality of core dies includes an output control circuit for receiving read data in the first order from a memory area, for sorting consecutive bits of the read data to be positioned adjacent to each other so that the read data becomes second parallel data, and for transferring the second parallel data to the respective first to n-th internal input/output lines, and wherein the base die includes a serial circuit for re-sorting the second parallel data transferred via the respective first to n-th internal input/output lines into the read data and a read inversion circuit for generating a read inversion signal using the re-sorted read data and selectively inverting the re-sorted read data according to the read inversion signal.

8. The stacked semiconductor device of claim 7, wherein, when the read data is input in the first order from a first bit to an eighth bit, the output control circuit sorts the consecutive bits and transfers the second parallel data by sequentially transferring the first bit and the eighth bit to the first internal input/output line, sequentially transferring the second bit and the third bit to the second internal input/output line, sequentially transferring the sixth bit and the seventh bit to the third internal input/output line, and sequentially transferring the fourth bit and the fifth bit to the fourth internal input/output line.

9. The stacked semiconductor device of claim 7, wherein, when the read data is input in the first order from a first bit to an eighth bit, the output control circuit sorts the consecutive bits and transfers the second parallel data by sequentially transferring the first bit and the eighth bit to the first internal input/output line, sequentially transferring the second bit and the third bit to the second internal input/output line, sequentially transferring the fourth bit and the fifth bit to the third internal input/output line, and sequentially transferring the sixth bit and the seventh bit to the fourth internal input/output line.

10. The stacked semiconductor device of claim 7, wherein, when the read data is input in the first order from a first bit to a fourth bit, the output control circuit sorts the consecutive bits and transfers the second parallel data by sequentially transferring the first bit and the fourth bit to the first internal input/output line and sequentially transferring the second bit and the third bit to the second internal input/output line.

11. The stacked semiconductor device of claim 7, wherein the serial circuit includes:
a strobe generation circuit for generating a read strobe signal based on a first clock signal and a second clock signal;
a serial control circuit for generating a plurality of serial pulse signals sequentially activated on each cycle of the read strobe signal; and
a serializer for serializing the second parallel data into the read data according to the serial pulse signals.

12. A semiconductor device, comprising:
a first semiconductor chip for receiving write data in a first order and a write inversion signal, and for sorting consecutive bits of the write data to be positioned adjacent to each other so that the write data becomes parallel data and for transferring the parallel data to respective first to n-th internal input/output lines, where n is an integer greater than or equal to 2; and
at least one second semiconductor chip for converting the parallel data transferred via the respective first to n-th internal input/output lines into the write data and for selectively inverting the converted write data according to the write inversion signal.

13. The semiconductor device of claim 12,
wherein the first semiconductor chip is a master chip communicating with a controller, and wherein the at least one second semiconductor chip is a slave chip controlled by the first semiconductor chip.

14. The semiconductor device of claim 12, wherein the at least one second semiconductor chip is stacked on the first semiconductor chip and is connected via a plurality of through-electrodes.

15. The semiconductor device of claim 12, wherein the first semiconductor chip includes:
an input buffer for receiving the write data and the write inversion signal;
a latch circuit for latching the write data in response to a rising edge and a falling edge of a write strobe signal and outputting first latch data and second latch data;
a parallel control circuit for generating a plurality of parallel pulse signals sequentially activated on each predetermined cycle of the write strobe signal; and
a parallelizer for sorting the first latch data and the second latch data according to the parallel pulse signals and transferring the sorted first latch data and second latch data to the respective first to n-th internal input/output lines.

16. The semiconductor device of claim 12, wherein the at least one second semiconductor chip includes:
an input control circuit for converting the parallel data into the write data according to a plurality of write pulse signals sequentially activated;
a write inversion circuit for selectively inverting the converted write data according to the write inversion signal and transferring the converted write data to a core global line; and
a memory area where the converted write data transferred to the core global line is written.

17. A semiconductor device, comprising:
a first semiconductor chip for receiving read data in a first order from a memory area, for sorting consecutive bits of the read data to be positioned adjacent to each other so that the read data becomes parallel data, and for transferring the parallel data to respective first to n-th internal input/output lines, where n is an integer greater than or equal to 2; and
a second semiconductor chip for converting the parallel data transferred via the respective first to n-th internal input/output lines into the read data, for generating a read inversion signal using the converted read data, and for selectively inverting the converted read data according to the read inversion signal.

18. The semiconductor device of claim 17,
wherein the second semiconductor chip is a master chip communicating with a controller, and
wherein the first semiconductor chip is a slave chip controlled by the second semiconductor chip.

19. The semiconductor device of claim 17, wherein the first semiconductor chip is stacked on the second semiconductor chip and is connected via a plurality of through-electrodes.

20. The semiconductor device of claim 17, wherein the second semiconductor chip includes:
a strobe generation circuit for generating a read strobe signal based on a first clock signal and a second clock signal;
a serial control circuit for generating a plurality of serial pulse signals sequentially activated on each cycle of the read strobe signal;
a serializer for serializing the parallel data into the read data according to the serial pulse signals; and
a read inversion circuit for generating the read inversion signal using the read data and selectively inverting the read data according to the read inversion signal.

21. A method of operating a stacked semiconductor device including a base die and a plurality of core dies stacked on the base die and coupled through a plurality of through-electrodes, the method comprising:
receiving, by the base die, write data in a first order and a write inversion signal;
sorting, by the base die, consecutive bits of the write data to be positioned adjacent to each other so that the write data becomes first parallel data and transferring the first parallel data to respective first to n-th internal input/output lines, where n is an integer greater than or equal to 2;
converting, by the plurality of core dies, the first parallel data transferred via the respective first to n-th internal input/output lines into the write data; and
selectively inverting, by the plurality of core dies, the converted write data according to the write inversion signal.

22. The method of claim 21, further comprising:
receiving, by the plurality of core dies, read data in the first order from a memory area;
sorting, by the plurality of core dies, consecutive bits of the read data to be positioned adjacent to each other so that the read data becomes second parallel data and transferring the second parallel data to the respective first to n-th internal input/output lines;
converting, by the base die, the second parallel data transferred via the respective first to n-th internal input/output lines into the read data; and
generating, by the base die, a read inversion signal using the converted read data and selectively inverting the converted read data according to the read inversion signal.

* * * * *